US010845701B2

(12) United States Patent
Jun et al.

(10) Patent No.: US 10,845,701 B2
(45) Date of Patent: *Nov. 24, 2020

(54) PHOTOSENSITIVE COMPOSITIONS, PREPARATION METHODS THEREOF, QUANTUM DOT POLYMER COMPOSITE PREPARED THEREFROM

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Shin Ae Jun, Seongnam-si (KR); Shang Hyeun Park, Yongin-si (KR); Hojeong Paek, Suwon-si (KR); Jonggi Kim, Suwon-si (KR); Hyeyeon Yang, Yongin-si (KR); Eun Joo Jang, Suwon-si (KR); Yong Seok Han, Anyang-si (KR)

(73) Assignees: SAMSUNG ELECTRONICS CO., LTD., Gyeonggi-Do (KR); SAMSUNG SDI CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/241,208

(22) Filed: Aug. 19, 2016

(65) Prior Publication Data
US 2017/0059986 A1 Mar. 2, 2017

(30) Foreign Application Priority Data

Aug. 24, 2015 (KR) .................. 10-2015-0119128

(51) Int. Cl.
G03F 7/00 (2006.01)
G03F 7/033 (2006.01)
(Continued)

(52) U.S. Cl.
CPC ............ G03F 7/0007 (2013.01); C09K 11/02 (2013.01); C09K 11/08 (2013.01); G02B 5/207 (2013.01); G02B 5/223 (2013.01); G03F 7/033 (2013.01)

(58) Field of Classification Search
CPC ... G03F 7/031; G03F 7/16; G03F 7/20; G03F 7/321; G03F 7/028; G03F 7/029;
(Continued)

(56) References Cited

U.S. PATENT DOCUMENTS 7,199,393 B2 4/2007 Park et al.
7,306,899 B2 12/2007 Wu
(Continued)

FOREIGN PATENT DOCUMENTS

CN 104880856 * 9/2015
EP 1526584 A2 4/2005
(Continued)

OTHER PUBLICATIONS

Sartomer Company, Material Safety Data Sheet for Sarbox SB400 (May 2007).*
(Continued)

Primary Examiner — Martin J Angebranndt
(74) Attorney, Agent, or Firm — Cantor Colburn LLP

(57) ABSTRACT

A photosensitive composition including a quantum dot dispersion, a photopolymerizable monomer having a carbon-carbon double bond, and a photoinitiator, wherein the quantum dot dispersion includes an acid group-containing polymer and a plurality of quantum dots dispersed in the acid group-containing polymer, and wherein the acid group-containing polymer includes a copolymer of a monomer combination including a first monomer having a carboxylic acid group or a phosphonic acid group and a carbon-carbon double bond and a second monomer having a carbon-carbon
(Continued)

Repeating the patterning process three times double bond and a hydrophobic group and not having a carboxylic acid group and a phosphonic acid group.

**18 Claims, 10 Drawing Sheets
(1 of 10 Drawing Sheet(s) Filed in Color)**

(51) Int. Cl.
  *G02B 5/22* (2006.01)
  *G02B 5/20* (2006.01)
  *C09K 11/08* (2006.01)
  *C09K 11/02* (2006.01)
  *G03F 7/004* (2006.01)

(58) Field of Classification Search
  CPC .......... G03F 7/30; G03F 7/0007; G03F 7/033; G03F 7/0047; G02B 5/223; G02B 5/207; C09K 11/02; C09K 11/08
  See application file for complete search history.

(56) References Cited

U.S. PATENT DOCUMENTS

| | | | |
|---|---|---|---|
| 7,476,487 B2 | 1/2009 | Park et al. | |
| 8,211,597 B2 | 7/2012 | Su et al. | |
| 8,268,519 B2* | 9/2012 | Nakashima | G03F 7/0007 430/287.1 |
| 8,642,991 B2 | 2/2014 | Park et al. | |
| 8,758,864 B2 | 6/2014 | Park et al. | |
| 8,911,883 B2 | 12/2014 | Park et al. | |
| 9,921,472 B2* | 3/2018 | Yang | G03F 7/0047 |
| 2003/0066998 A1 | 4/2003 | Lee | |
| 2003/0199616 A1* | 10/2003 | Yamashita | C04B 24/2647 524/2 |
| 2006/0166132 A1 | 7/2006 | Meagley | |
| 2010/0117110 A1* | 5/2010 | Park | B82Y 20/00 257/98 |
| 2011/0160358 A1* | 6/2011 | Arai | C09B 67/0041 524/90 |
| 2014/0158937 A1* | 6/2014 | Jang | C09K 11/025 252/301.36 |
| 2015/0299501 A1* | 10/2015 | Zhao | C09C 1/28 252/586 |
| 2016/0011506 A1* | 1/2016 | Gu | G03F 7/027 430/288.1 |
| 2016/0084476 A1* | 3/2016 | Koole | C09K 11/02 362/84 |
| 2017/0052444 A1* | 2/2017 | Park | B82Y 20/00 |
| 2017/0059988 A1* | 3/2017 | Paek | G03F 7/033 |
| 2017/0115561 A1* | 4/2017 | Yang | G03F 7/0007 |
| 2017/0158954 A1* | 6/2017 | Yang | C09K 11/025 |
| 2017/0176811 A1* | 6/2017 | Gu | G02F 1/133514 |
| 2017/0176854 A1* | 6/2017 | Park | G03F 7/0043 |
| 2017/0183565 A1* | 6/2017 | Jun | C09K 11/025 |
| 2017/0186922 A1* | 6/2017 | Kim | H01L 33/504 |

FOREIGN PATENT DOCUMENTS

| | | | | |
|---|---|---|---|---|
| JP | 11-149153 | * | 6/1999 | |
| JP | 2015-121702 | * | 7/2015 | ............ G03F 7/038 |
| KR | 0697511 B1 | | 3/2007 | |
| WO | 2009079061 A2 | | 6/2009 | |
| WO | 2015/018154 | * | 2/2015 | |
| WO | 2015/100968 | * | 7/2015 | |

OTHER PUBLICATIONS

Printout form Yuang Hong Corporation website, catalog for Sarbox specialty polymers (1 page, website copyright 2011).*

Dominik Janczewski et al. "Synthesis of functionalized amphiphilic polymers for coating quantum dots", Nature Protocols, 2011, 6(10), 1546.

Extended European Search Report dated Feb. 24, 2017, issued for the corresponding European Patent Application No. 16184922.9-1568.

* cited by examiner

Pattern Preparation Process by using a photoresist

Repeating the patterning process three times

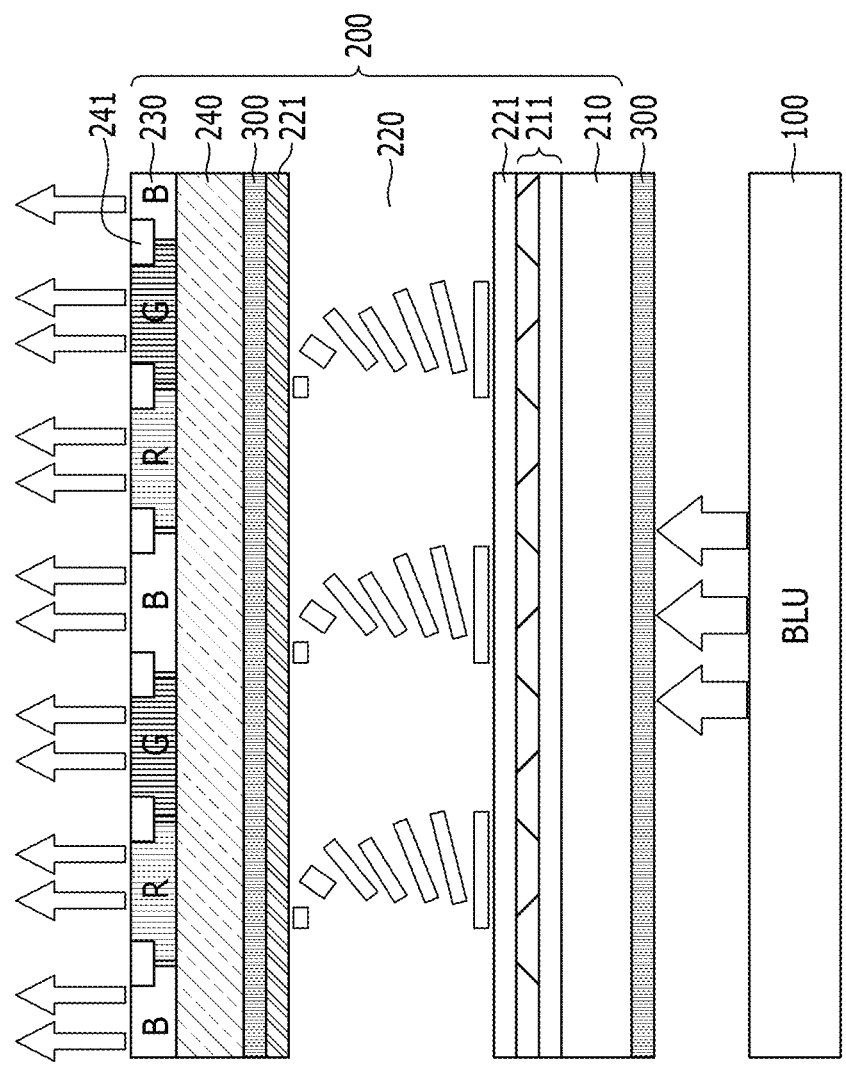

PHOTOSENSITIVE COMPOSITIONS, PREPARATION METHODS THEREOF, QUANTUM DOT POLYMER COMPOSITE PREPARED THEREFROM

CROSS-REFERENCE TO RELATED APPLICATION

This application claims priority to Korean Patent Application No. 10-2015-0119128 filed in the Korean Intellectual Property Office on Aug. 24, 2015, and all the benefits accruing therefrom under 35 U.S.C. § 119, the content of which is incorporated herein in its entirety by reference.

BACKGROUND

1. Field

A photosensitive composition, a method of preparing the same, a quantum dot-polymer composite prepared therefrom, and an electronic device including the same are disclosed.

2. Description of the Related Art

By colloidal synthesis, the particle size of Quantum dots (QD) may be relatively freely and uniformly controlled. The QDs having a size of less than or equal to about 10 nm may exhibit a more significant quantum confinement effect as their size decreases and thereby their bandgap increases. In this case, the energy density of the QDs may be enhanced.

The QDs are applicable for various display devices (e.g., LCD) in the form of a QD-polymer composite. For the application of the QD-polymer composites in various devices, there remains a need to develop a technique for patterning the quantum dot-polymer composite.

SUMMARY

An embodiment is related to a photosensitive composition capable of preparing a pattern of a quantum dot-polymer composite or a patternable quantum dot-polymer composite.

Another embodiment is related to a production method of the aforementioned photosensitive composition.

Another embodiment is related to a quantum dot-polymer composite prepared from the aforementioned photosensitive composition.

Yet another embodiment provides a color filter including the quantum dot-polymer composite.

Yet another embodiment provides a display device including the quantum dot-polymer composite.

In an embodiment, a photosensitive composition includes:
a quantum dot dispersion;
a photopolymerizable monomer having a carbon-carbon double bond; and
a photoinitiator,
wherein the quantum dot dispersion includes an acid group-containing polymer and a plurality of quantum dot dispersed in the acid group-containing polymer, and
wherein the acid group-containing polymer includes a copolymer of a monomer combination including a first monomer having a carboxylic acid group or a phosphonic acid group and a carbon-carbon double bond and a second monomer having a carbon-carbon double bond and a hydrophobic group and not having a carboxylic acid group and a phosphonic acid group.

The quantum dot may include an organic ligand with a hydrophobic group bound to a surface thereof. In some embodiments, the organic ligand does not include a photopolymerizable functional group such as a (meth)acryl moiety.

The acid group-containing polymer may have an acid value of greater than or equal to about 120 milligrams of KOH per gram and less than or equal to about 200 milligrams of KOH per gram.

The acid group-containing polymer may have an acid value of greater than or equal to about 125 milligrams of KOH per gram and less than or equal to about 200 milligrams of KOH per gram.

The organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a C5 to C24 aliphatic hydrocarbon group, a C5 to C20 alicyclic hydrocarbon group, or a C5 to C20 aromatic hydrocarbon group), a polymeric organic ligand, or a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

In the photosensitive composition, the copolymer may include a first repeating unit derived from a first monomer and a second repeating unit derived from a second monomer, and
the first repeating unit may include a repeating unit represented by Chemical Formula 1-1, a repeating unit represented by Chemical Formula 1-2, or a combination thereof:

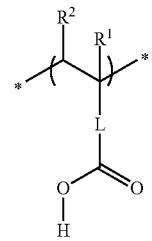

Chemical Formula 1-1 wherein
$R^1$ is hydrogen, a C1 to C3 alkyl group, or $-(CH_2)_{n1}-$COOH (wherein n1 is 0 to 2),
$R^2$ is hydrogen, a C1 to C3 alkyl group, or $-COOH$,
L is a single bond, a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, and
* indicates a portion connected to an adjacent atom;

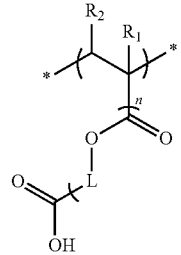

Chemical Formula 1-2 wherein

R$^1$ is hydrogen, a C1 to C3 alkyl group, or —(CH$_2$)$_{n1}$—COOH (wherein n is 0 to 2), R$^2$ is hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, n is an integer of 1 to 3, and

* indicates a portion connected to an adjacent atom.

The second repeating unit may include a repeating unit represented by Chemical Formula 2, a repeating unit represented by Chemical Formula 4, a repeating unit represented by Chemical Formula 5, a repeating unit represented by Chemical Formula A, or a combination thereof:

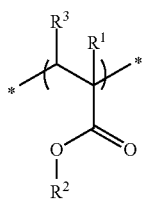

Chemical Formula 2 wherein

R$^1$ is hydrogen or a C1 to C3 alkyl group, R$^2$ is a C1 to C15 aliphatic hydrocarbon group, a C6 to C30 aromatic hydrocarbon group, a C6 to C30 alicyclic hydrocarbon group (for example, a cycloalkyl group such as cyclohexyl or norbornyl or a cycloalkenyl group such as norbornene), or a C1 to C15 aliphatic hydrocarbon group substituted with a C6 to C30 aromatic hydrocarbon group or a C6 to C30 alicyclic hydrocarbon group, R$^3$ is hydrogen or a C1 to C3 alkyl group, and

* indicates a portion connected to an adjacent atom;

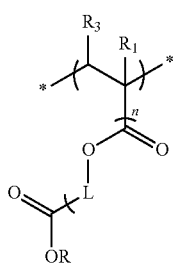

Chemical Formula 4 wherein

R$^1$ is hydrogen or a C1 to C3 alkyl group,

L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R$^2$ is a C1 to C15 aliphatic hydrocarbon group, a C6 to C30 aromatic hydrocarbon group, a C6 to C30 alicyclic hydrocarbon group (for example, a cycloalkyl group such as cyclohexyl or norbornyl or a cycloalkenyl group such as norbornene), or a C1 to C15 aliphatic hydrocarbon group substituted with a C6 to C30 aromatic hydrocarbon group or a C6 to C30 alicyclic hydrocarbon group, R$^3$ is hydrogen or a C1 to C3 alkyl group, n is an integer of 1 to 3, and

* indicates a portion connected to an adjacent atom;

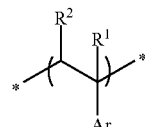

Chemical Formula 5 wherein each of R$^1$ and R$^2$ is independently hydrogen or a C1 to C3 alkyl group, Ar is a substituted or unsubstituted C6 to C30 aromatic hydrocarbon group or a substituted or unsubstituted C6 to C30 alicyclic hydrocarbon group, and

* indicates a portion connected to an adjacent atom;

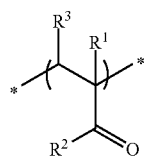

Chemical Formula A wherein

R$^1$ is hydrogen or a C1 to C3 alkyl group,

R$^2$ is a C1 to C15 aliphatic hydrocarbon group, a C6 to C30 aromatic hydrocarbon group, a C6 to C30 alicyclic hydrocarbon group (for example, a cycloalkyl group such as cyclohexyl or norbornyl or a cycloalkenyl group such as norbornene), or a C1 to C15 aliphatic hydrocarbon group substituted with a C6 to C30 aromatic hydrocarbon group or a C6 to C30 alicyclic hydrocarbon group, R$^3$ is hydrogen or a C1 to C3 alkyl group, and

* indicates a portion connected to an adjacent atom.

The monomer combination may further include a third monomer having a carbon-carbon double bond and a hydrophilic moiety and not having a carboxylic acid group and a phosphonic acid group.

The copolymer may include a third repeating unit derived from the third monomer and the third repeating unit may be represented by Chemical Formula 3:

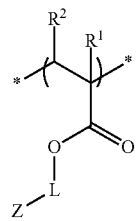

Chemical Formula 3 wherein each of $R^1$ and $R^2$ is independently hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion connected to an adjacent atom.

In the acid group-containing polymer, an amount of the first repeating unit may be greater than or equal to about 5 mole percent and less than or equal to about 95 mole percent.

The acid group-containing polymer may be a copolymer of (meth)acrylic acid and the second and third monomer selected from alkyl(meth)acrylate, arylalkyl(meth)acrylate, hydroxyalkyl (meth)acrylate, and styrene.

A weight average molecular weight of the acid group-containing polymer may be greater than or equal to about 1,000 grams per mole and less than or equal to about 100,000 grams per mole.

The photopolymerizable monomer including a carbon-carbon double bond may include a diacrylate compound, a triacrylate compound, a tetraacrylate compound, a pentaacrylate compound, a hexaacrylate compound, or a combination thereof.

The photosensitive composition may be developable by an alkali aqueous solution.

The photosensitive composition may further include a solvent and it may include:

about 1 percent by weight to about 40 percent by weight % of the quantum dots;

about 0.5 percent by weight % to about 35 percent by weight % of the acid group-containing polymer;

about 0.5 percent by weight % to about 30 percent by weight % of the photopolymerizable monomer;

about 0.01 percent by weight % to about 10 percent by weight % of the photoinitiator; and a balance amount of the solvent based on the total weight of the composition.

The photosensitive composition may further include a light diffusing agent selected from the group consisting of a metal oxide particle, a metal particle, and a combination thereof.

The photosensitive composition may further include a dispersant for the light diffusing agent or the quantum dots.

In another embodiment, a production method of the aforementioned photosensitive composition includes:

dissolving an acid group-containing polymer in a solvent to prepare a polymer solution;

combining a plurality of quantum dots having an organic ligand bound to a surface thereof with the polymer solution to obtain a quantum dot-polymer dispersion; and combining the quantum dot-polymer dispersion with at least one of a photopolymerizable monomer having a carbon-carbon double bond, a photoinitiator, and a solvent.

In another embodiment, a quantum dot-polymer composite includes:

a matrix including an acid group-containing polymer and a polymerization product of a photopolymerizable monomer having a carbon-carbon double bond; and a plurality of quantum dots including an organic ligand that may bound to a surface thereof;

wherein the acid group-containing polymer includes a copolymer of a monomer combination including a first monomer having a carboxylic acid group or a phosphonic acid group and a carbon-carbon double bond and a second monomer having a carbon-carbon double bond and a hydrophobic group and not having a carboxylic acid group and a phosphonic acid group; and wherein the plurality of quantum dots are dispersed in the matrix.

The copolymer may be a linear polymer. The photopolymerizable monomer may include a monomer having at least three (meth)acrylate groups and the polymerization product may include a crosslinked polymer.

The acid group-containing polymer may have an acid value of greater than or equal to about 120 milligrams of KOH per gram and less than or equal to about 200 milligrams of KOH per gram.

The acid group-containing polymer may have an acid value of greater than or equal to about 125 milligrams of KOH per gram and less than or equal to about 200 milligrams of KOH per gram.

The organic ligand may include a hydrophobic group and it may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a C5 to C24 aliphatic hydrocarbon group, a C5 to C20 alicyclic hydrocarbon group, or a C5 to C20 aromatic hydrocarbon group), a polymeric organic ligand, or a combination thereof.

The quantum dot may include a Group II-VI compound, a Group III-V compound, a Group IV-VI compound, a Group IV compound, a Group I-III-VI compound, a Group I-II-IV-VI compound, or a combination thereof.

The monomer combination may further include a third monomer having a carbon-carbon double bond and a hydrophilic moiety and not having a carboxylic acid group and a phosphonic acid group.

In the photosensitive composition, the copolymer may include a first repeating unit derived from the first monomer and a second repeating unit derived from the second monomer, and the first repeating unit may include a repeating unit represented by Chemical Formula 1-1, a repeating unit represented by Chemical Formula 1-2, or a combination thereof:

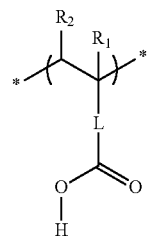

Chemical Formula 1-1 wherein $R^1$ is hydrogen, a C1 to C3 alkyl group, or —$(CH_2)_{n1}$—COOH (wherein n is 0 to 2), $R^2$ is hydrogen, a C1 to C3 alkyl group, or —COOH, L is a single bond, a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, and

* indicates a portion connected to an adjacent atom;

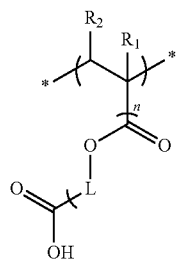

Chemical Formula 1-2 wherein $R^1$ is hydrogen, a C1 to C3 alkyl group, or —$(CH_2)_{n1}$—COOH (wherein n is 0 to 2), $R^2$ is hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, n is an integer of 1 to 3, and

* indicates a portion connected to an adjacent atom.

The second repeating unit may include a repeating unit represented by Chemical Formula 2, a repeating unit represented by Chemical Formula 4, a repeating unit represented by Chemical Formula 5, a repeating unit represented by Chemical Formula A, or a combination thereof:

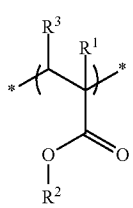

Chemical Formula 2 wherein $R^1$ is hydrogen or a C1 to C3 alkyl group, $R^2$ is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, and $R^3$ is hydrogen or a C1 to C3 alkyl group, and

* indicates a portion connected to an adjacent atom;

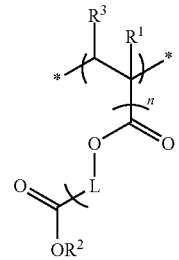

Chemical Formula 4 wherein $R^1$ is hydrogen or a C1 to C3 alkyl group,

L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, $R^2$ is a C1 to C15 aliphatic hydrocarbon group, a C6 to C30 aromatic hydrocarbon group, a C6 to C30 alicyclic hydrocarbon group (for example, a cycloalkyl group such as cyclohexyl or norbornyl or a cycloalkenyl group such as norbornene), or a C1 to C15 aliphatic hydrocarbon group substituted with a C6 to C30 aromatic hydrocarbon group or a C6 to C30 alicyclic hydrocarbon group, $R^3$ is hydrogen or a C1 to C3 alkyl group, n is an integer of 1 to 3, and

* indicates a portion connected to an adjacent atom;

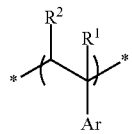

Chemical Formula 5 wherein each of $R^1$ and $R^2$ is independently hydrogen or a C1 to C3 alkyl group, Ar is a substituted or unsubstituted C6 to C30 aromatic hydrocarbon group or a substituted or unsubstituted C6 to C30 alicyclic hydrocarbon group, and

* indicates a portion connected to an adjacent atom;

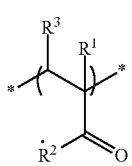

Chemical Formula A wherein $R^1$ is hydrogen or a C1 to C3 alkyl group, $R^2$ is a C1 to C15 aliphatic hydrocarbon group, a C6 to C30 aromatic hydrocarbon group, a C6 to C30 alicyclic hydrocarbon group (for example, a cycloalkyl group such as cyclohexyl or norbornyl or a cycloalkenyl group such as norbornene), or a C1 to C15 aliphatic hydrocarbon group substituted with a C6 to C30 aromatic hydrocarbon group or a C6 to C30 alicyclic hydrocarbon group, $R^3$ is hydrogen or a C1 to C3 alkyl group, and

* indicates a portion connected to an adjacent atom.

The acid group-containing polymer may include a copolymer of a monomer combination that further includes a third monomer having a carbon-carbon double bond and a hydrophilic moiety and not having a carboxylic acid group and a phosphonic acid group.

The copolymer may include a third repeating unit derived from the third monomer, and the third repeating unit may be represented by Chemical Formula 3:

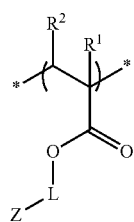

Chemical Formula 3 wherein each of $R^1$ and $R^2$ is independently hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion connected to an adjacent atom.

In the acid group-containing polymer, an amount of the first repeating unit may be greater than or equal to about 5 mole percent and less than or equal to about 95 mole percent.

The acid group-containing polymer may include a copolymer of (meth)acrylic acid and at least one monomer selected from alkyl(meth)acrylate, arylalkyl(meth)acrylate, hydroxyalkyl (meth)acrylate, and styrene.

The quantum dot-polymer composite may be a pattern.

Another embodiment provides a color filter including a quantum dot-polymer composite prepared from the photosensitive composition.

Yet another embodiment provides a display device including the quantum dot-polymer composite.

The aforementioned photosensitive composition may prepare a quantum dot-polymer composite pattern in an environmentally friendly manner. The photosensitive composition of the embodiments may be applied to a conventional photo-resist process without any additional surface treatment for the quantum dots. The pattern thus prepared may show enhanced stability even under heat-treatment carried out during the photo-resist process.

BRIEF DESCRIPTION OF THE DRAWINGS

The present patent application contains at least one drawing executed in color. Copies of this application with color drawing(s) will be provided by the Office upon request and payment of the necessary fee.

These and/or other aspects will become apparent and more readily appreciated from the following description of the embodiments, taken in conjunction with the accompanying drawings in which:

FIG. 10 is a schematic illustration of a cross-section of a display device according to a non-limiting embodiment.

DETAILED DESCRIPTION

Figure 1:
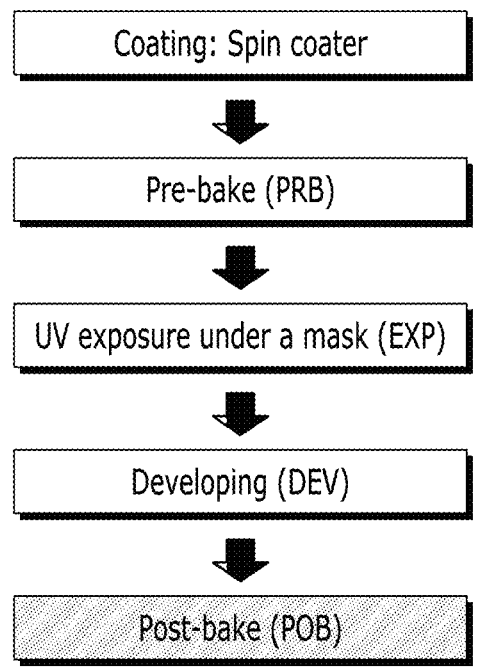
FIG. 1 is a view showing a pattern forming process according to an embodiment to explain critical dimension uniformity.
Figure 1:
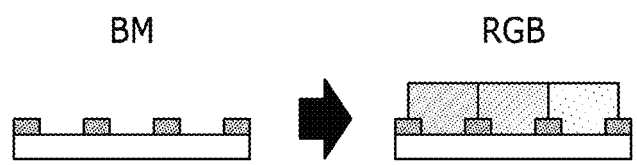

Advantages and characteristics of this disclosure, and a method for achieving the same, will become evident referring to the following exemplary embodiments together with the drawings attached hereto. The embodiments, may, however, be embodied in many different forms and should not be construed as being limited to the embodiments set forth herein. Accordingly, the exemplary embodiments are merely described below, by referring to the figures, to explain aspects of the present inventive concept. Expressions such as "at least one of," when preceding a list of elements, modify the entire list of elements and do not modify the individual elements of the list. If not defined otherwise, all terms (including technical and scientific terms) in the specification may be defined as commonly understood by one skilled in the art. The terms defined in a generally-used dictionary should be interpreted as having a meaning that is consistent with their meaning in the context of the relevant art and the present disclosure, and may not be interpreted ideally or overly broadly unless clearly defined. In addition, unless explicitly described to the contrary, the word "comprise" and variations such as "comprises" or "comprising", and the word "include" and variations such as "includes" or "including", when used in this specification, specify the presence of stated features, regions, integers, steps, operations, elements, and/or components, but do not preclude the presence or addition of one or more other features, regions, integers, steps, operations, elements, components, and/or groups thereof. Therefore, the above words will be understood to imply the inclusion of stated elements but not the exclusion of any other elements.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "alkyl group" refers to a group derived from a straight or branched chain saturated aliphatic hydrocarbon having the specified number of carbon atoms and having a valence of at least one.

As used herein, the term "alkenyl group" may refer to a straight or branched chain, monovalent hydrocarbon group having at least one carbon-carbon double bond.

As used herein, the term "alkynyl group" refers to a straight or branched chain, monovalent hydrocarbon group having at least one carbon-carbon triple bond.

As used herein, the term "cycloalkyl group" refers to a monovalent group having one or more saturated rings in which all ring members are carbon.

As used herein, the term "aryl", which is used alone or in combination, refers to an aromatic hydrocarbon group containing at least one ring and having the specified number of carbon atoms. The term "aryl" may be construed as including a group with an aromatic ring fused to at least one cycloalkyl ring.

As used herein, the term "arylalkyl group" refers to a substituted or unsubstituted aryl group covalently linked to an alkyl group that is linked to a compound.

As used herein, when a definition is not otherwise provided, the term "substituted" refers to a compound, a group, or a moiety wherein at least one of hydrogen atoms thereof is substituted with a substituent selected from a 01 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C20 alkyl" refers to a C1 to C20 alkyl group substituted with a C6 to C20 aryl group, the total number of carbon atoms in the resulting aryl substituted alkyl group is C7 to C40.

As used herein, the term "alkylene group" may refer to a straight or branched saturated aliphatic hydrocarbon group having a valence of at least two, optionally substituted with one or more substituents. As used herein, the term "cycloalkylene group" may refer to a saturated alicyclic hydrocarbon group having a valence of at least two, optionally substituted with one or more substituents. The term "arylene group" may refer to a functional group having a valence of at least two obtained by removal of at least two hydrogens in an aromatic ring, optionally substituted with one or more substituents.

As used herein, the term "(meth)acrylate" refers to acrylate and/or methacrylate.

As used herein, the term "hydrophobic group" refers to a group that causes a given compound including the same to show agglomeration in an aqueous solution and to have a tendency to repel water. For example, the hydrophobic group may include an aliphatic hydrocarbon group having a carbon number of greater than or equal to 2 (alkyl, alkenyl, alkynyl, etc.), an aromatic hydrocarbon group having a carbon number of greater than or equal to 6 (phenyl, naphthyl, aralkyl group, etc.), or an alicyclic hydrocarbon group having a carbon number of greater than or equal to 5 (e.g., cycloalkyl group such as cyclohexyl or norbornyl or a cycloalkenyl group such as norbornene, etc.). The hydrophobic group substantially lacks an ability to make a hydrogen bond with an ambient medium and is not substantially mixed with the medium as its polarity is not matched with that of the medium.

As used herein, the term "visible light" refers to light having a wavelength of about 390 nanometers (nm) to about 700 nm. As used herein, the term "UV light" refers to light having a wavelength of greater than or equal to about 200 nm and less than about 390 nm.

As used herein, the term "dispersion" refers to a dispersion wherein a dispersed phase is a solid and a continuous phase includes a liquid.

For example, the term "dispersion" may refer to a colloidal dispersion wherein the dispersed phase has a dimension of about 1 nm to about 1 micrometer (μm).

As used herein, the term "group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Ru, and Cs, but are not limited thereto.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

Hereinafter, the term "binder" or "acid group-containing binder" refers to the "acid group (e.g., carboxylic acid or phosphonic acid)-containing polymer."

In an embodiment, a photosensitive composition includes:
a plurality of quantum dots including an organic ligand with a hydrophobic moiety on a surface thereof;
an acid group-containing polymer;
a photopolymerizable monomer having a carbon-carbon double bond;
a photoinitiator; and
a solvent,
wherein the carboxy group-containing binder includes a copolymer of a monomer mixture including a first monomer having a carboxyl group and a carbon-carbon double bond and a second monomer having a carbon-carbon double bond and a hydrophobic moiety and not having a carboxyl group. The plurality of quantum dots may be dispersed by the binder.

The photosensitive composition includes:
a quantum dot dispersion;
a photopolymerizable monomer having a carbon-carbon double bond; and
a photoinitiator.

The quantum dot dispersion includes an acid group-containing polymer and a plurality of quantum dots, which may include one or more quantum dot. The acid group-containing polymer includes a copolymer of a monomer combination including a first monomer having a carboxylic acid group ($—CO_2H$) or a phosphonic acid group ($—PO_3H_2$) and a carbon-carbon double bond and a second monomer having a carbon-carbon double bond and a hydrophobic group and not having a carboxylic acid group and a phosphonic acid group. The quantum dots are dispersed (for example, separated from one another) by the binder. The quantum dot dispersion may further include a solvent. In some embodiments, the photosensitive composition does not include a compound having at least two thiol groups (e.g., at its terminal ends).

The quantum dot (hereinafter also referred to as a semiconductor nanocrystal) is not particularly limited, and may be prepared in any known method or is a commercially available. For example, the quantum dot may be a Group II-VI compound, a Group III-V compound, a Group IV-VI compound, a Group IV element or compound, a Group I-III-VI compound, a Group I-II-IV-VI compound, or a combination thereof.

The Group II-VI compound may be selected from:
a binary element compound selected from CdSe, CdTe, ZnS, ZnSe, ZnTe, ZnO, HgS, HgSe, HgTe, MgSe, MgS, and a combination thereof;
a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and
a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group II-VI compound may further include a Group III metal.

The Group III-V compound may be selected from:
a binary element compound selected from GaN, GaP, GaAs, GaSb, AlN, AlP, AlAs, AlSb, InN, InP, InAs, InSb, and a combination thereof;
a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a combination thereof; and
a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compound may further include a Group II metal (e.g., InZnP).

The Group IV-VI compound may be selected from:
a binary element compound selected from SnS, SnSe, SnTe, PbS, PbSe, PbTe, and a combination thereof;
a ternary element compound selected from SnSeS, SnSeTe, SnSTe, PbSeS, PbSeTe, PbSTe, SnPbS, SnPbSe, SnPbTe, and a combination thereof; and
a quaternary element compound selected from SnPbSSe, SnPbSeTe, SnPbSTe, and a combination thereof.

Examples of the Group I-III-VI compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may include:

a single-element selected from Si, Ge, and a combination thereof; and a binary element compound selected from SiC, SiGe, and a combination thereof.

The binary element compound, the ternary element compound or the quaternary element compound may respectively be included in a uniform concentration in the particle or partially different concentrations in the same particle. The semiconductor nanocrystal particle may have a core-shell structure wherein a first semiconductor nanocrystal is surrounded by a second semiconductor nanocrystal that is different from the first semiconductor nanocrystal. The interface between the core and the shell may have a concentration gradient wherein the concentration of an element of the shell decreases toward the core. In addition, the semiconductor nanocrystal particle may have a semiconductor nanocrystal core and a multi-layered shell surrounding the semiconductor nanocrystal core. The core and multi-layered shell structure has at least two layers of the shell wherein each layer may be a single composition, an alloy, or the one having a concentration gradient.

In the semiconductor nanocrystal particle, the materials of the shell may have a larger energy bandgap than that of the core, and thereby the semiconductor nanocrystal may exhibit a quantum confinement effect more effectively. In case of a multi-layered shell type of semiconductor nanocrystal particle, the bandgap of the material of an outer layer of the shell may be higher energy than that of the material of an inner layer of the shell (a layer that is closer to the core). In this case, the semiconductor nanocrystal particle may emit light of a UV to infrared wavelength range.

The semiconductor nanocrystal may have a quantum yield of greater than or equal to about 10 percent (%), or greater than or equal to about 30%, for example, greater than or equal to about 50%, greater than or equal to about 60%, greater than or equal to about 70%, or greater than or equal to about 90%.

For use in display devices, the semiconductor nanocrystal may have a narrower FWHM so as to realize enhanced color purity or color reproducibility. The semiconductor nanocrystal may have a FWHM of less than or equal to about 45 nm, for example less than or equal to about 40 nm, or less than or equal to about 30 nm. While not wishing to be bound by theory, it is understood that within such ranges, a device including the nanocrystal may have enhanced color purity or improved color reproducibility.

The quantum dot (i.e., the semiconductor nanocrystal particle) may have a particle diameter (the longest diameter for a non-spherically shaped particle) of about 1 nm to about 100 nm. For example, the quantum dot may have a particle diameter (the longest diameter for a non-spherically shaped particle) of about 1 nm to about 20 nm, for example, from 2 nm (or from 3 nm) to 15 nm.

The quantum dot may have a generally-used shape in this art, and is not particularly limited. For example, the quantum dot may include various three-dimensional shapes such as spherical shape, elliptical shape, cubical shape, tetrahedral shape, pyramidal shape, octahedral shape, cylindrical shape, polygonal shape, multi-armed shape, or any of various common regular and irregular shapes. The quantum dots may also have various vertical and horizontal cross-sectional shapes, for example, circular shape, triangular shape, quasi-triangular shape, triangular shape with semi-circles, triangular shape with one or more rounded corners, square shape, rectangular shape, rectangular shape with semi-circles, polygonal shape, or any of various common regular and irregular shapes. The quantum dots may be in the form of nanotubes, nanowires, nanofibers, nanoplate particles, a combination thereof, or the like.

The quantum dot is commercially available or may be synthesized in any method known in the art. For example, several nano-sized quantum dots may be synthesized according to a wet chemical process. In the wet chemical process, precursors react in an organic solvent to grow nanocrystal particles, and the organic solvent or a ligand compound may coordinate (bound) to the surface of the semiconductor nanocrystal, thereby controlling the growth of the nanocrystal. Examples of the organic solvent and ligand compound are known. The organic solvent coordinated to the surface of the quantum dot may affect stability of a device, and thus excess organic materials that are not coordinated to the surface of the quantum dot may be removed by pouring the quantum dot into an excessive amount of a non-solvent, and centrifuging the resulting mixture. Examples of the non-solvent may be acetone, ethanol, methanol, and the like, but are not limited thereto. After the removal of extra organic materials, the amount of the organic materials coordinated to the surface of the quantum dots may be less than or equal to about 50 percent by weight (wt %), for example, less than or equal to about 30 wt %, less than or equal to about 20 wt %, or less than or equal to about 10 wt % based on the total weight of the quantum dots. The organic material may include a ligand compound, an organic solvent, or a combination thereof.

The quantum dot may have an organic ligand having a hydrophobic group, which is bonded to the surface of the quantum dot. In an embodiment, the organic ligand may be a monofunctional organic ligand (i.e., an organic ligand having only one functional group, which is bonded to the surface of the quantum dot). In another embodiment, the organic ligand having a hydrophobic group may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a C5 to C24 alkyl group, a C5 to C24 alkenyl group, or a C5 to C20 aryl group), a polymeric organic ligand, or a combination thereof.

Examples of the organic ligand compound bonded the surface of the quantum dot may include:

thiol compounds such as methane thiol, ethane thiol, propane thiol, butane thiol, pentane thiol, hexane thiol, octane thiol, dodecane thiol, hexadecane thiol, octadecane thiol, or benzyl thiol;

amine compounds such as methane amine, ethylamine, propylamine, butylamine, pentylamine, hexylamine, octylamine, nonylamine, decylamine, dodecylamine, hexadecyl amine, octadecyl amine, dimethylamine, diethyl amine, dipropyl amine, tributylamine, or trioctylamine;

carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid;

phosphine compounds such as methyl phosphine, ethyl phosphine, propyl phosphine, butyl phosphine, pentyl phosphine, octylphosphine, dioctyl phosphine, diphenyl phosphine, triphenyl phosphine, tributylphosphine, or trioctylphosphine;

phosphine oxide compounds such as methyl phosphine oxide, ethyl phosphine oxide, propyl phosphine oxide, butyl phosphine oxide, pentyl phosphine oxide, diphenyl phosphine oxide, triphenyl phosphine oxide, tributyl phosphine oxide, octylphosphine oxide, dioctyl phosphine oxide, or trioctyl phosphine oxide;

a C5 to C20 alkyl phosphinic acid compounds such as hexylphosphinic acid, octylphosphinic acid, dodecanephosphinic acid, tetradecanephosphinic acid, hexadecanephosphinic acid, or octadecanephosphinic acid; and the like, but are not limited thereto.

The quantum dot may include the hydrophobic organic ligand alone or as a combination of two or more organic ligands.

An amount of the quantum dot including the organic ligand may be greater than or equal to about 1 wt %, for example, greater than or equal to about 5 wt %, or greater than or equal to about 10 wt %, based on the total amount of the composition. The amount of the quantum dot including the organic ligand may be less than or equal to about 40 wt %, for example, less than or equal to about 35 wt %, based on the total amount of the composition. In some embodiments, the amount of the quantum dot including the organic ligand may be about 5 wt % to 40 wt %, based on a total weight of solid contents (non-volatile components) of the compositions.

The quantum dot may have a theoretical quantum yield (QY) of about 100%, and may emit light having high color purity (e.g., a full width at half maximum (FWHM) of less than or equal to about 40 nm), and thus it may achieve the enhanced luminous efficiency and the improved color reproducibility. Meanwhile, it is expected that using a photoluminescent type of color filter instead of the absorption type of color filter may widen the viewing angle and improve the luminance. Accordingly, while not wishing to be bound by theory, it is believed that using a color filter including a quantum dot polymer composite may allow realizing a display having high brightness, a wide viewing angle, and high color reproducibility. In order to realize the aforementioned properties, however, it may be required to well-disperse a relatively large number of quantum dots in the polymer composite.

As a method of forming a pattern including quantum dots in conventional arts, U.S. Pat. No. 7,199,393 discloses that quantum dots having a photosensitive functional group on the surface thereof are used in a patterning method, the entire content of which is incorporated herein by reference. In the disclosed method, a photosensitive functional group is introduced onto the surface of a quantum dot and subjected to photopolymerization, if desired together with a photopolymerizable monomer, to prepare a quantum dot-polymer composite pattern. But the disclosed method requires an additional process of a surface treatment of quantum dots and needs to use an organic solvent to form a pattern during a developing process.

On the other hand, when the quantum dots (e.g., in which organic ligand is bound to the surface) are mixed with the alkali-developable photoresist without performing any surface treatment in an attempt to provide an alkali-developable quantum dot-polymer composite pattern, they are not dispersed well or are even agglomerated because the quantum dots have poor compatibility with the conventional photoresist. In order for the patterned quantum dot-polymer composite to be applied in a color filter, a large amount of quantum dots should be able to be included in the composite. When the quantum dots cannot be dispersed in the composition, it becomes impossible to provide a uniform pattern.

In the photosensitive composition according to an embodiment, the quantum dot including an organic ligand (e.g., having a hydrophobic group) bonded to the surface is first dispersed in the solution of the acid group-containing binder having a hydrophobic group. The obtained quantum dot-binder dispersion is then mixed with the other components for a photoresist. As a result, the quantum dots may be well dispersed in the alkali-developable photoresist. Therefore, in case of the photosensitive composition according to an embodiment, a relatively large amount of the quantum dots may be well dispersed in the photoresist composition. Without wishing to be bound by any theory, it is understood that when the quantum dots are dispersed in the solution of the acid group-containing binder having a hydrophobic group, the binder may facilitate the formation of the dispersion including the quantum dots, and the quantum dots dispersed with the help of the binder may maintain their dispersed state even when they constitute a photoresist composition.

Therefore, the photosensitive composition of the embodiments includes a quantum dot dispersion that includes an acid group-containing binder and a plurality of the quantum dots dispersed (e.g., separated from one another) in the binder. The acid group-containing binder may include a copolymer of a monomer combination including the first monomer having a carboxylic acid group or a phosphonic acid group and a carbon-carbon double bond and the second monomer having a carbon-carbon double bond and a hydrophobic group but including no carboxylic acid group and no phosphonic acid group.

As the photosensitive composition according to an embodiment may provide a quantum dot-polymer composite pattern including the quantum dot with no photo-polymerizable functional group (e.g., carbon-carbon double bond such as (meth)acrylate), no surface treatment for the quantum dot surface is necessary. In addition, a developing process for a pattern prepared from the aforementioned photosensitive composition does not require a use of an organic solvent such as toluene or NMP in the developing process.

Examples of the first monomer may include, but are not limited to, acrylic acid, methacrylic acid, maleic acid, itaconic acid, fumaric acid, 3-butenoic acid, carboxylic acid vinyl ester compounds such as vinyl acetate, and vinyl benzoate. The first monomer may include one or more compounds.

Examples of the second monomer may include, but are not limited to:

alkenyl aromatic compounds such as styrene, α-methyl styrene, vinyl toluene, or vinyl benzyl methyl ether;

unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;

unsaturated carboxylic acid amino alkyl ester compounds such as 2-dimethyl amino ethyl acrylate, or 2-dimethyl amino ethyl methacrylate;

maleimides such as N-phenylmaleimide, N-benzylmaleimide, N-alkylmaleimide;

unsaturated carboxylic acid glycidyl ester compounds such as glycidyl acrylate or glycidyl methacrylate;

vinyl cyanide compounds such as acrylonitrile or methacrylonitrile; and unsaturated amide compounds such as acrylamide or methacrylamide, but are not limited thereto.

As the second monomer, at least one compound may be used.

The acid group-containing binder may have an acid value of greater than about 120 milligrams of KOH per gram (mg KOH/g) in order to disperse quantum dots, but the acid value may vary depending on a chemical structure thereof (e.g., a chemical structure of a main chain or a hydrophobic group at the side chain). In some embodiments, the acid group-containing binder may have an acid value of greater than or equal to about 70 mg KOH/g, greater than or equal to about 80 mg KOH/g, greater than or equal to about 90 mg KOH/g, greater than or equal to about 100 mg KOH/g, or greater than or equal to about 110 mg KOH/g. In some embodiments, the acid group-containing binder may have an acid value of greater than or equal to about 125 mg KOH/g or an acid value of greater than or equal to about 130 mg KOH/g, The acid group-containing binder may have an acid value of, for example, less than or equal to about 200 mg KOH/g, for example, less than or equal to about 190 mg KOH/g, less than or equal to about 180 mg KOH/g, or less than or equal to about 160 mg KOH/g, but it is not limited thereto. While not wishing to be bound by theory, it is understood that when the quantum dots are mixed with a solution of a binder having the acid value within the aforementioned range to provide a quantum dot-binder dispersion, the obtained quantum dot-binder dispersion may have the improved compatibility with the other components for the photoresist (e.g., photopolymerizable monomer, photoinitiator, solvent, etc.), and thereby the quantum dots may be well dispersed in the final composition (i.e., photoresist composition) to form a pattern. In an embodiment, the acid group-containing binder may have an acid value of about 100 mg KOH/g to about 200 mg KOH/g.

The acid group-containing binder may include a copolymer of a monomer combination that includes the first and second monomers, and may further include a third monomer having a carbon-carbon double bond and a hydrophilic moiety and not having a carboxylic acid group and a phosphonic acid group.

Examples of the third monomer may include 2-hydroxy ethyl acrylate, 2-hydroxy ethyl methacrylate, 2-hydroxy butyl acrylate, 2-hydroxy butyl methacrylate, 2-amino ethyl acrylate, and 2-amino ethyl methacrylate, but are not limited thereto. The third monomer may include one or more compounds.

The first repeating unit may include a repeating unit represented by Chemical Formula 1-1, a repeating unit represented by Chemical Formula 1-2, or a combination thereof:

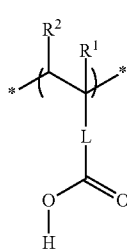

Chemical Formula 1-1 wherein
R$^1$ is hydrogen, a C1 to C3 alkyl group, or —(CH$_2$)$_{n1}$—COOH (wherein n1 is 0 to 2),
R$^2$ is hydrogen, a C1 to C3 alkyl group, or —COOH,
L is a single bond, a C1 to C15 aliphatic hydrocarbon group such as a C1 to C3 alkylene group, a C6 to C30 aromatic hydrocarbon group such as a C6 to C12 arylene group, a C6 to C30 alicyclic hydrocarbon group such as a cycloalkylene group (e.g. a cyclohexylene or a norbornane moiety), a cycloalkenylene group (e.g., a norbornene moiety) and the like, or a C1 to C15 aliphatic hydrocarbon group substituted with a C6 to C30 aromatic hydrocarbon group or a C6 to C30 alicyclic hydrocarbon group, and
* indicates a portion linked to an adjacent atom;

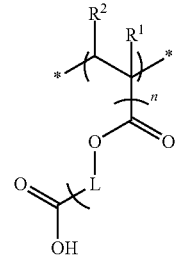

Chemical Formula 1-2 wherein
R$^1$ is hydrogen, a C1 to C3 alkyl group, or —(CH$_2$)$_{n1}$—COOH (wherein n1 is 0 to 2),
R$^2$ is hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group (e.g., a cycloalkylene group such as a cyclohexylene or a norbornane moiety or cycloalkenylene group such as a norbornene moiety), or a C1 to C15 aliphatic hydrocarbon group substituted with a C6 to C30 aromatic hydrocarbon group or a C6 to C30 alicyclic hydrocarbon group,
n is an integer of 1 to 3, and
* indicates a portion linked to an adjacent atom.

The second repeating unit may include a repeating unit represented by Chemical Formula 2, a repeating unit represented by Chemical Formula 4, a repeating unit represented by Chemical Formula 5, a repeating unit represented by Chemical Formula A, or a combination thereof:

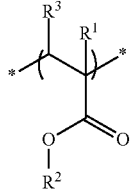

Chemical Formula 2 wherein
R$^1$ is hydrogen or a C1 to C3 alkyl group,
R$^2$ is a C1 to C15 aliphatic hydrocarbon group (e.g., a C1 to C15 alkyl group such as methyl, ethyl, propyl, and the like), a C6 to C30 aromatic hydrocarbon group (a C6 to C24 aryl group such as a phenyl group, a naphthyl group or the like), a C6 to C30 alicyclic hydrocarbon group such as a cycloalkyl group (e.g., a cyclohexyl group, a norbornyl group, or the like), or a C1 to C15 aliphatic hydrocarbon group substituted with a C6 to C30 aromatic hydrocarbon group or a C6 to C30 alicyclic hydrocarbon group (e.g., an arylalkyl group),
R$^3$ is hydrogen or a C1 to C3 alkyl group, and
* indicates a portion linked to an adjacent atom;

Chemical Formula 4

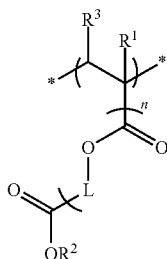

wherein $R^1$ is hydrogen or a C1 to C3 alkyl group,

L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group (e.g., a cycloalkylene group such as a cyclohexylene or a norbornane moiety or a cycloalkenylene group such as a norbornene moiety), or a C1 to C15 aliphatic hydrocarbon group substituted with a C6 to C30 aromatic hydrocarbon group or a C6 to C30 alicyclic hydrocarbon group, $R^2$ is a 01 to C15 aliphatic hydrocarbon group (e.g., a C1 to C15 alkyl group such as methyl, ethyl, propyl, and the like), a C6 to C30 aromatic hydrocarbon group (e.g., a C6 to C24 aryl group such as a phenyl group, a naphthyl group, or the like), a C6 to C30 alicyclic hydrocarbon group such as a cycloalkyl group (e.g., a cyclohexyl group, a norbornyl group, or the like), or a C1 to C15 aliphatic hydrocarbon group substituted with a C6 to C30 aromatic hydrocarbon group or a C6 to C30 alicyclic hydrocarbon group (e.g., an arylalkyl group), $R^3$ is hydrogen or a C1 to C3 alkyl group, n is an integer of 1 to 3, and

* indicates a portion linked to an adjacent atom;

Chemical Formula 5

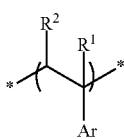

wherein each of $R^1$ and $R^2$ is independently hydrogen or a C1 to C3 alkyl group, Ar is a substituted or unsubstituted C6 to C30 aromatic hydrocarbon group (e.g., an aryl group such as phenyl and an arylalkyl group such as benzyl and the like), or a substituted or unsubstituted C6 to C30 alicyclic hydrocarbon group, and

* indicates a portion linked to an adjacent atom;

Chemical Formula A

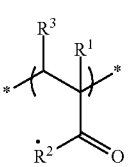

wherein $R^1$ is hydrogen or a C1 to C3 alkyl group, $R^2$ is a C1 to C15 aliphatic hydrocarbon group, a C6 to C30 aromatic hydrocarbon group, a C6 to C30 alicyclic hydrocarbon group (for example, a cycloalkyl group or a cycloalkenyl group such as norbornene), or a C1 to C15 aliphatic hydrocarbon group substituted with a C6 to C30 aromatic hydrocarbon group or a C6 to C30 alicyclic hydrocarbon group, $R^3$ is hydrogen or a C1 to C3 alkyl group, and

* indicates a portion linked to an adjacent atom.

The copolymer may further include a third repeating unit derived from a third monomer, and the third repeating unit may be represented by Chemical Formula 3:

Chemical Formula 3

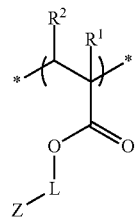

wherein each of $R^1$ and $R^2$ is independently hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group (e.g., a cycloalkylene group such as a cyclohexylene or a norbornane moiety or a cycloalkenylene group such as a norbornene moiety), or a C1 to C15 aliphatic hydrocarbon group substituted with a C6 to C30 aromatic hydrocarbon group or a C6 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion linked to an adjacent atom.

In an embodiment, the acid group-containing binder may include a copolymer of (meth)acrylic acid (i.e., the first monomer) and at least one of the second and third monomer selected from alkyl(meth)acrylate, arylalkyl(meth)acrylate, hydroxyalkyl (meth)acrylate, and styrene.

In the acid group-containing binder, an amount of the first repeating unit derived from the first monomer may be greater than or equal to about 5 mole percent (mol %), for example, greater than or equal to about 6 mol %, greater than or equal to about 7 mol %, greater than or equal to about 8 mol %, greater than or equal to about 9 mol %, greater than or equal to about 10 mol %, greater than or equal to about 15 mol %, greater than or equal to about 25 mol %, or greater than or equal to about 35 mol %. In the acid group-containing binder, an amount of the first repeating unit may be less than or equal to about 95 mol %, for example, less than or equal to about 94 mol %, less than or equal to about 93 mol %, less than or equal to about 92 mol %, less than or equal to about 91 mol %, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In the acid group-containing binder, an amount of the second repeating unit derived from the second monomer may be may be greater than or equal to about 5 mol %, for example, greater than or equal to about 6 mol %, greater than or equal to about 7 mol %, greater than or equal to about 8 mol %, greater than or equal to about 9 mol %, greater than or equal to about 10 mol %, greater than or equal to about 15 mol %, greater than or equal to about 25 mol %, or greater than or equal to about 35 mol %. In the acid group-containing binder, an amount of the second repeating unit may be less than or equal to about 95 mol %, for example, less than or equal to about 94 mol %, less than or equal to about 93 mol %, less than or equal to about 92 mol %, less than or equal to about 91 mol %, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

In the acid group-containing binder, an amount of the third repeating unit derived from the third monomer may be greater than or equal to about 1 mol %, for example, greater than or equal to about 5 mol %, greater than or equal to about 10 mol %, or greater than or equal to about 15 mol %. In the acid group-containing binder, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

The acid group-containing binder may include a copolymer of a (meth)acrylic acid, and at least one monomer selected from an alkyl(meth)acrylate, an arylalkyl(meth)acrylate, a hydroxyalkyl (meth)acrylate, and styrene. For example, the acid group-containing binder may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

The acid group-containing binder may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The acid group-containing binder may have a weight average molecular weight of less than or equal to about 100,000 g/mol, for example, less than or equal to about 50,000 g/mol. While not wishing to be bound by theory, it is understood that within the foregoing ranges, more improved developability may be ensured.

In the photosensitive composition, an amount of the acid group-containing binder may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on the total weight of the composition. An amount of the acid group-containing binder may be less than or equal to about 40 wt %, for example, less than or equal to about 30 wt % based on the total weight of the composition. In an embodiment, an amount of the acid group-containing binder may be 5 to 40 wt % based on the total weight of solids (i.e., non-volatiles) of the composition. While not wishing to be bound by theory, it is understood that within the aforementioned range, appropriate developability and improved processability may be accomplished in a subsequent pattern forming process while ensuring dispersibility of the quantum dots.

The photosensitive composition according to an embodiment includes a photopolymerizable monomer having at least one (e.g., two, three, four, five, six, or more) carbon-carbon double bond (e.g., an acrylate group or a methacrylate group). Types of the photopolymerizable monomer are not particularly limited as long as they include a carbon-carbon double bond and may be polymerized by light. For example, the photopolymerizable monomer may be a monomer or an oligomer that may be used in a photosensitive composition. The photopolymerizable monomer may include a monofunctional or multi-functional ester of (meth) acrylic acid having at least one ethylenic unsaturated double bond. For example, the photopolymerizable monomer may include a vinyl monomer, an unsaturated ethylenic oligomer, a homopolymer thereof, a copolymer of the unsaturated ethylenic oligomer and an ethylenic unsaturated monomer, or a combination thereof. Examples of the photopolymerizable monomer may include, but are not limited to, alkyl (meth)acrylate, ethylene glycol di(meth)acrylate, 1,4-butanediol di(meth)acrylate, 1,6-hexanediol di(meth)acrylate, neopentyl glycol di(meth)acrylate, pentaerythritol di(meth) acrylate, pentaerythritol tri(meth)acrylate, pentaerythritol tetra(meth)acrylate, dipentaerythritol di(meth)acrylate, dipentaerythritol tri(meth)acrylate, dipentaerythritol penta (meth)acrylate, dipentaerythritol hexa(meth)acrylate, bisphenol A epoxyacrylate, bisphenol A di(meth)acrylate, trimethylolpropane tri(meth)acrylate, ethylene glycol monomethyl ether (meth)acrylate, novolacepoxy (meth) acrylate, diethylene glycol di(meth)acrylate, triethylene glycol di(meth)acrylate, propylene glycol di(meth)acrylate, tris (meth)acryloyloxyethyl phosphate, and the like. The photopolymerizable monomer of the embodiments may include a di(meth)acrylate compound, a tri(meth)acrylate compound, a tetra(meth)acrylate compound, a penta(meth) acrylate compound, a hexa(meth) acrylate compound, or a combination thereof.

In the photosensitive composition, the amount of the photopolymerizable monomer may be greater than or equal to about 0.5 wt %, for example, greater than or equal to about 1 wt %, or greater than or equal to about 2 wt % with respect to a total amount of the composition. The amount of the photopolymerizable monomer may be less than or equal to about 30 wt %, for example less than or equal to about 25 wt %, less than or equal to about 20 wt %, the amount of the photopolymerizable monomer may be 10 wt % with respect to a total amount of the composition.

The photosensitive composition may include a photopolymerization initiator. Types of the photopolymerization initiator are not particularly limited, and may be selected appropriately. For example, the available photopolymerization initiator may include a triazine compound, an acetophenone compound, a benzophenone compound, a thioxanthone compound, a benzoin compound, an oxime compound, or a combination thereof, but it is not limited thereto.

Examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s- triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-trichloromethyl (piperonyl)-6-triazine, and 2,4-trichloromethyl (4'-methoxystyryl)-6-triazine, but are not limited thereto.

Examples of the acetophenone compound may be 2,2'-diethoxyacetophenone, 2,2'-dibutoxyacetophenone, 2-hydroxy-2-methylpropiophenone, p-t-butyltrichloro acetophenone, p-t-butyldichloro acetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, but are not limited thereto.

Examples of the benzophenone compound may be benzophenone, benzoyl benzoate, benzoyl methyl benzoate, 4-phenyl benzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may be thioxanthone, 2-methyl thioxanthone, 2-isopropyl thioxanthone, 2,4-diethyl thioxanthone, 2,4-di-iso-propyl thioxanthone, 2-chlorothioxanthone, and the like, but are not limited thereto.

Examples of the benzoin compound may include benzoin, benzoin methyl ether, benzoin ethyl ether, benzoin iso-propyl ether, benzoin iso-butyl ether, benzyl dimethyl ketal, and the like, but are not limited thereto.

Examples of the oxime compound may be 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone, and the like, but are not limited thereto.

The photopolymerization initiator may also be a carbazole compound, a diketone compound, a sulfonium borate compound, a diazo compound, a di-imidazole compound, and the like, in addition to the photopolymerization initiators.

In the photosensitive composition, an amount of the photoinitiator may be greater than or equal to about 0.01 wt %, for example, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. In an embodiment, the amount of the photoinitiator may be about 0.05 to about 10 wt % based on the total weight of solids (i.e., non-volatiles) of the composition. While not wishing to be bound by theory, it is understood that within the aforementioned ranges, a desirable pattern may be formed.

If desired, the photosensitive composition may further include various additives such as a light diffusing agent, a leveling agent, or a coupling agent in addition to the aforementioned components. The amount of the additive is not particularly limited, and may be selected within an appropriate range wherein the additive does not cause an adverse effect on the photosensitive composition and the pattern obtained therefrom.

The light diffusing agent may increase a refractive index of the composition in order to increase a chance of the incident light to meet with quantum dots. The light diffusing agent may include inorganic oxide particles such as alumina, silica, zirconia, titanium oxide particulates, or zinc oxide, and metal particles such as gold, silver, copper, or platinum, but is not limited thereto.

The leveling agent is aimed to prevent stains or spots and to improve planarization and leveling characteristics of a film, and examples thereof may include the following but are not limited thereto.

A fluorine-containing leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428°, and the like of Toray Silicone Co., Ltd.

Types and amounts of the additives may be adjusted as necessary.

The coupling agent is aimed to increase adherence with respect to the substrate and examples thereof may include a silane-containing coupling agent. Examples of the silane-containing coupling agent may be vinyl trimethoxysilane, vinyl tris(2-methoxyethoxy)silane, 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like.

The photosensitive composition may include a solvent. The solvent may be included in the quantum dot dispersion. An amount of the solvent may be determined based on the amounts of the above main components (i.e., the organic ligand-containing quantum dots, the acid group-containing binder, the photopolymerizable monomer combination, and the photoinitiator), and additives. The composition may include the solvent in such an amount that the remaining amount of the composition other than the amounts of the solid (i.e., non-volatiles) components is the amount of the solvent. The solvent may be selected appropriately based on its affinity for other components (e.g., the binder, the photopolymerizable monomer, the photoinitiator, and other additives), its affinity for the alkali developing solution, and its boiling point. Examples of the solvent may be:

ethyl 3-ethoxy propionate;

an ethylene glycol such as ethylene glycol, diethylene glycol, or polyethylene glycol;

a glycol ether such as ethylene glycol monomethyl ether, ethylene glycol monoethyl ether, diethylene glycol monomethyl ether, ethylene glycol diethyl ether, and diethylene glycol dimethyl ether;

a glycol ether acetate such as ethylene glycol acetate, ethylene glycol monoethyl ether acetate, diethylene glycol monoethyl ether acetate, and diethylene glycol monobutyl ether acetate;

a propylene glycol such as propylene glycol;

a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether;

a propylene glycol ether acetate such as propylene glycol monomethyl ether acetate and dipropylene glycol monoethyl ether acetate;

an amide such as N-methylpyrrolidone, dimethyl formamide, and dimethyl acetamide;

a ketone such as methyl ethyl ketone (MEK), methyl iso-butyl ketone (MIBK), and cyclohexanone;

a petroleum product such as toluene, xylene, and solvent naphtha;

an ester such as ethyl acetate, butyl acetate, and ethyl lactate; an ether such as diethyl ether, dipropyl ether, and dibutyl ether;

and any combinations thereof.

A method of preparing a photosensitive composition according to an embodiment includes:

dissolving the acid group-containing binder in the solvent to prepare a binder solution;

dispersing a plurality of quantum dots having an organic ligand bonded to a surface thereof in the binder solution to obtain a quantum dot-binder dispersion; and combining the quantum dot-binder dispersion with at least one selected from a photoinitiator, a photopolymerizable monomer, and a solvent.

A mixing manner is not particularly limited, and may be appropriately selected. For example, each component may be mixed sequentially or simultaneously.

The method may further include selecting quantum dots including an organic ligand bonded to the surface thereof, and selecting a binder capable of dispersing the quantum dots (e.g., an acid group-containing binder). In the step of selecting the binder, the binder may be an acid group-containing binder, the acid group-containing binder may be a copolymer of a monomer combination including a first monomer having a carboxylic acid group or a phosphonic acid group and a carbon-carbon double bond and a second monomer having a carbon-carbon double bond and a hydrophobic group and not having a carboxylic acid group and a phosphonic acid group. A chemical structure and an acid value of the copolymer may be considered in this step.

Details of the quantum dots, the acid group-containing binder, the photopolymerizable monomer, and the photoinitiator are the same as set forth above.

The photosensitive composition may be developable with an alkaline aqueous solution, and thus a quantum dot-polymer composite pattern may be patterned from the photosensitive composition without using an organic solvent developing solution.

A non-limiting method of forming a pattern is explained referring to FIG. 1.

First, the photosensitive composition is coated on a predetermined substrate (e.g., a glass substrate or a glass substrate coated with a predetermined thickness of $SiN_x$ (protective layer) (e.g., 500 to 1,500 Angstroms (Å) of the protective layer)) in an appropriate manner such as spin coating, slit coating, and the like to form a film of a predetermined thickness (e.g., a thickness of 3 to 30 micrometers, μm). The formed film may be pre-baked, if desired. The specific conditions of pre-baking such as temperature, time, and atmosphere are known in the art and may be appropriately selected.

The formed (or optionally, pre-baked) film is exposed to light of a predetermined wavelength under a mask having a predetermined pattern. The wavelength and the intensity of light may be selected based on the types and the amounts of the photoinitiator, the types and the amounts of quantum dots, or the like.

The exposed film is treated with an alkali developing solution, and thereby the unexposed region in the film is dissolved to provide a desirable pattern. The obtained pattern may be post-baked, if desired, to improve crack resistance and solvent resistance of the pattern, for example, at a temperature of about 150° C. to about 230° C. for a predetermined time (e.g., greater than or equal to about 10 min or greater than or equal to about 20 min).

When a quantum dot-polymer composite obtained from the photosensitive composition is used as a color filter, two or three types of photosensitive compositions each including red quantum dots, green quantum dots, (or optionally, blue quantum dots) are prepared, and the patterning process is repeated as many times as needed for each composition to provide a quantum dot-polymer composite having a desirable pattern.

When the quantum dot-polymer composite obtained from the photosensitive composition is used as a color filter, two types of photosensitive compositions including red quantum dots and green quantum dots, respectively, may be prepared, and the patterning process may be repeated as many times as needed for each composition to provide a quantum dot-polymer composite having a desirable pattern.

Another embodiment provides a quantum dot-polymer composite, which includes:

a matrix including an acid group-containing polymer and a polymerization product of a photopolymerizable monomer having a carbon-carbon double bond; and a plurality of quantum dots including an organic ligand bonded to a surface thereof;

wherein the acid group-containing polymer includes a copolymer of a monomer combination including a first monomer having a carboxylic acid group or a phosphonic acid group and a carbon-carbon double bond and a second monomer having a carbon-carbon double bond and a hydrophobic group and not having a carboxylic acid group and a phosphonic acid group; and the plurality of quantum dots are dispersed (e.g., separated from one another) in the matrix (e.g., without agglomeration).

The composite may be a pattern.

Details of the quantum dots, the binder, the photopolymerizable monomer, and the like are the same as set forth above. The copolymer may be a linear polymer. The photopolymerizable monomer may include a monomer having at least three (meth)acrylate groups and the polymerization product may include a crosslinked polymer.

In some embodiments, a color filter includes the quantum dot-polymer composite or a pattern thereof. In another embodiment, a display device includes the quantum dot-polymer composite or a pattern thereof. The display device may be a liquid crystal display device.

Figure 9:
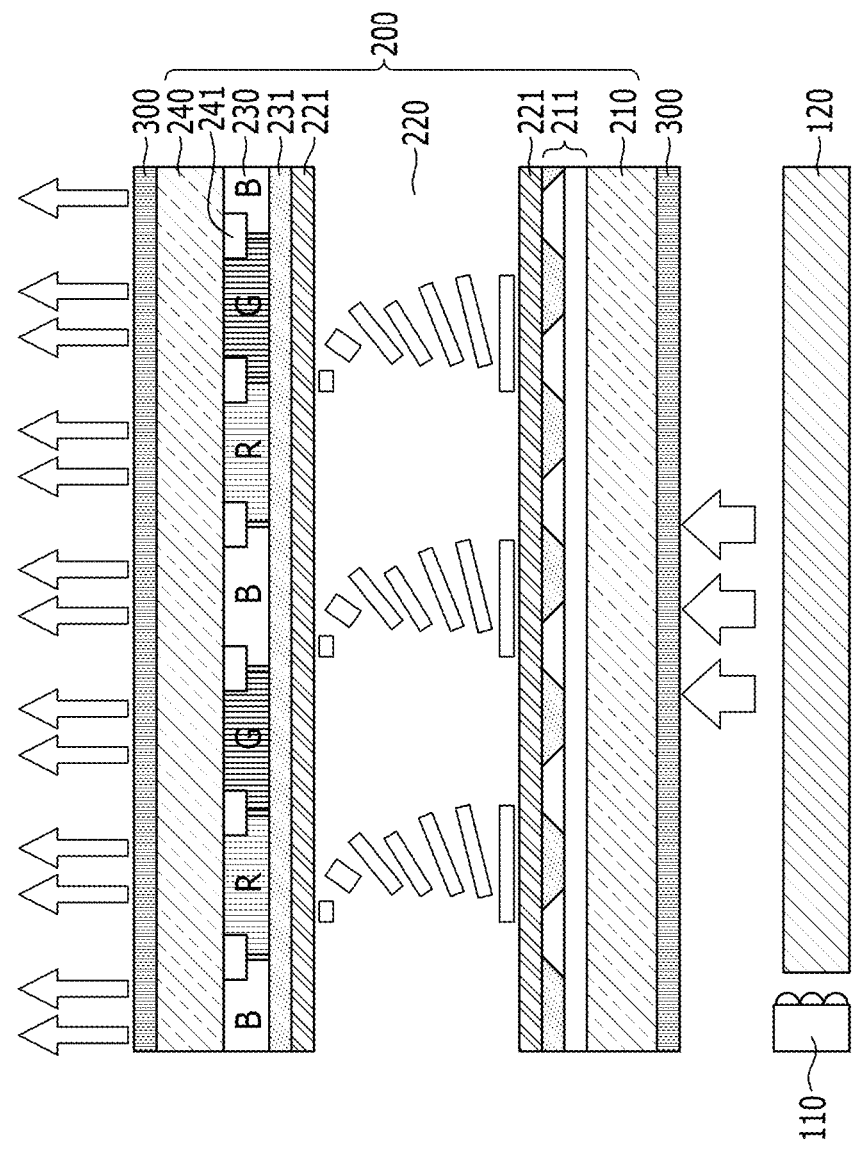
FIG. 9 is a schematic illustration of a cross-section of a display device according to a non-limiting embodiment.

Referring to FIG. 9 and FIG. 10, in a non-limiting embodiment, the liquid crystal display includes: a liquid crystal panel 200, an optical element 300 (e.g., a polarizing plate) that is disposed on and/or below the liquid crystal panel 200, and a back light unit that is disposed below the lower optical element 300 and includes a blue light emitting source. The liquid crystal panel 200 may include a lower substrate 210, an upper substrate 240, a liquid crystal layer 220 interposed between the upper and the lower substrates. The device include a color filter 230 disposed on a top surface or a bottom surface of the upper substrate 240. The color filter includes the aforementioned quantum dot-polymer composite or a pattern thereof.

The back light unit may include a light source 110 and optionally a light guide panel 120.

A wire plate 211 is disposed on an internal surface, e.g., a top surface, of the lower substrate 210. The wire plate 211 may include a plurality of gate wires (not shown) and data wires (not shown), a thin film transistor disposed adjacent to a crossing region of gate wires and data wires, and a pixel electrode for each pixel area, but is not limited thereto. In an embodiment, for example, pixel areas may be defined by the gate and data wires. The wire plate may have any structure or feature well-known in the art, and are not particularly limited.

The liquid crystal layer 220 may be disposed on the wire plate 211. The liquid crystal layer 220 may include alignment layers 221 on and under the layer 220 to initially align the liquid crystal material included therein. The liquid crystal material and the alignment layer may have any structure or feature well-known in the art (e.g., liquid crystal material, alignment layer material, method of forming liquid crystal layer, thickness of liquid crystal layer, or the like) and are not particularly limited.

The optical element 300 may be a member for maintaining polarization of light emitted from the photoluminescent color filter layer. In an embodiment, for example, the optical element 300 may be a polarizer. A black matrix 241 having an opening defined therethrough is disposed on the upper substrate 240, e.g., the bottom surface of the upper substrate 240, to cover a thin film transistor and a gate line, a data line, or the like of the wire plate disposed on the lower substrate 210. A photoluminescent color filter layer 230 including a first color filter (R) for emitting red light, a second color filter (G) for emitting green light, and/or a third color filter (B) for (emitting or transmitting) blue light may be disposed on the black matrix 241 and in the opening of the black matrix 241. In an exemplary embodiment, the black matrix 241 may have a lattice shape. A transparent common electrode 231 may be disposed on the photoluminescent color filter layer.

A liquid crystal display (hereinafter, LCD) is a display in which polarized light passes through a liquid crystal and then an absorption-type color filter to express a color. The LCD often has drawbacks such as a narrow viewing angle and low luminance due to a low level of light transmittance of the absorption-type color filter. For example, in the conventional LCD including the absorption-type color filter, the light (e.g. the white light) provided from the back light unit passes through the color filter to provide red, green, and blue light, and thus the intensity of light is inevitably decreased by one third. In contrast, in the display of the embodiments, the blue light from the back light unit passes through the color filter to provide light having a desired color without the aforementioned light loss occurring in the conventional LCD including the absorption-type color filter. Therefore, the display of the embodiments may show a luminance efficiency that is at least about three times greater than that of that conventional LCD. In addition, as the display of the embodiments includes the photoluminescent color filter, it may emit light at substantially the same intensity in all directions, allowing a wider viewing angle.

Hereinafter, the embodiments are illustrated in more detail with reference to examples. However, they are exemplary embodiments, and the present disclosure is not limited thereto.

EXAMPLES

Example 1

[1] Preparation of Quantum Dot-Binder Dispersion

A chloroform dispersion of red or green light emitting quantum dots (InP/ZnS) including oleic acid as a hydrophobic organic ligand bonded to a surface thereof is prepared.

The chloroform dispersion including 50 grams (g) of quantum dots (red) including oleic acid as a hydrophobic organic ligand bonded to a surface thereof is mixed with 100 g of a binder (a four membered copolymer of methacrylic acid, benzyl methacrylate, hydroxyethylmethacrylate, and styrene, acid value: 130 milligrams of KOH per gram, weight average molecular weight: 8,000, acrylic acid:benzylmethacrylate:hydroxyethylmethacrylate:styrene (molar ratio)=61.5%:12%:16.3%:10.2%) solution (polypropylene glycol monomethyl ether acetate having a concentration of 30 percent by weight) to provide a quantum dot-binder dispersion.

Figure 2:
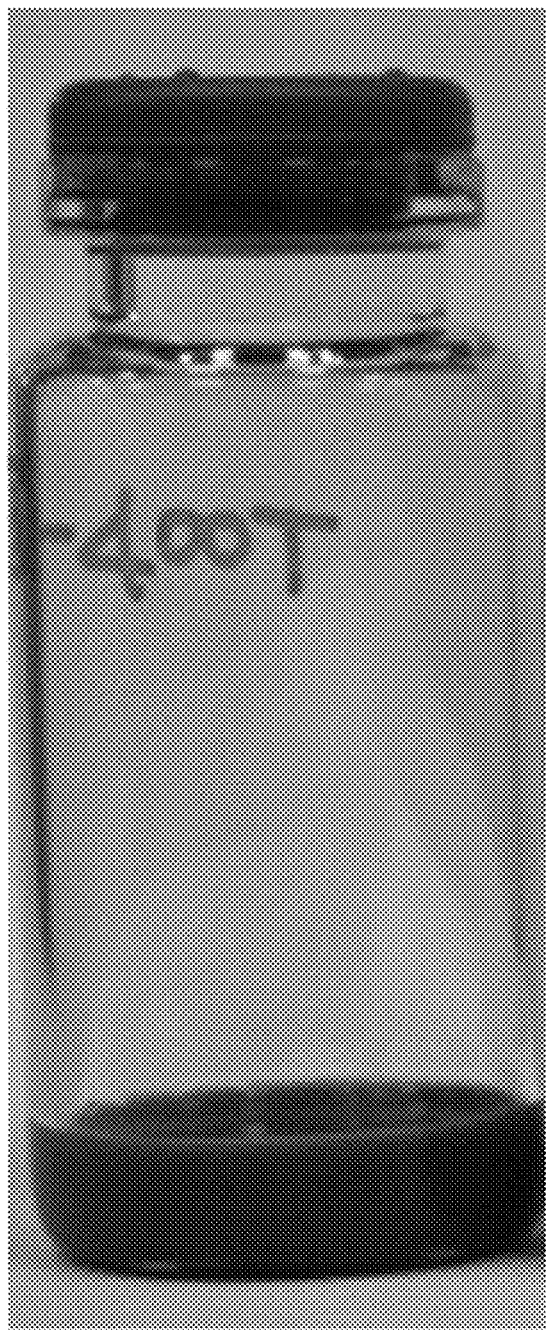
FIG. 2 is a photographic image showing a quantum dot-binder dispersion prepared in Example 1.

A photographic image of the dispersion thus prepared is shown in FIG. 2. FIG. 2 confirms that quantum dots are uniformly dispersed in the quantum dot-binder dispersion.

[2] Preparation of the Photosensitive Composition

To the quantum dot-binder dispersion, 100 g of hexaacrylate having the following structure (as a photopolymerizable monomer), 1 g of an oxime ester compound (as an initiator), 30 g of $TiO_2$ (as a light diffusing agent), and 300 g of PGMEA (as a solvent) are added to obtain a photosensitive composition. It is confirmed that the prepared photosensitive composition may form dispersion without any noticeable agglomeration even after the addition of the quantum dots.

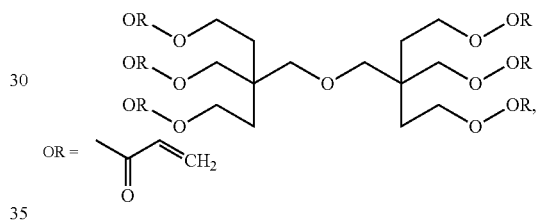

[3] Formation of Quantum Dot-Polymer Composite Pattern

The photosensitive composition obtained from item [2] is spin-coated on a glass substrate at 150 revolutions per minute (rpm) for 5 seconds (s) to provide a film. The obtained film is pre-baked at 100° C. for 2 min. The pre-baked film is irradiated with light (wavelength: 365 nanometers (nm), intensity: 100 millijoules, mJ) for 1 s under a mask having a predetermined pattern and developed by a potassium hydroxide-diluted aqueous solution (concentration: 0.043%) for 50 s to provide a pattern.

Figure 3:
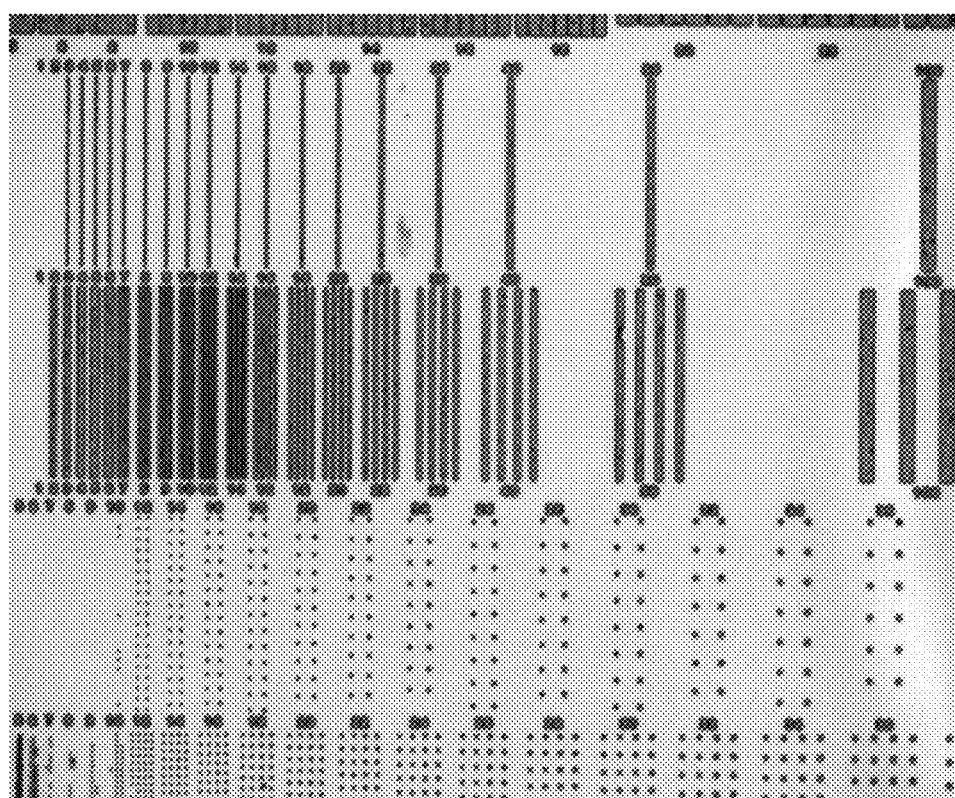
FIG. 3 is an optical microscope photograph of the quantum dot-polymer composite pattern prepared in Example 1.

An optical microscope image of the obtained pattern is shown in FIG. 3.

Figure 4:
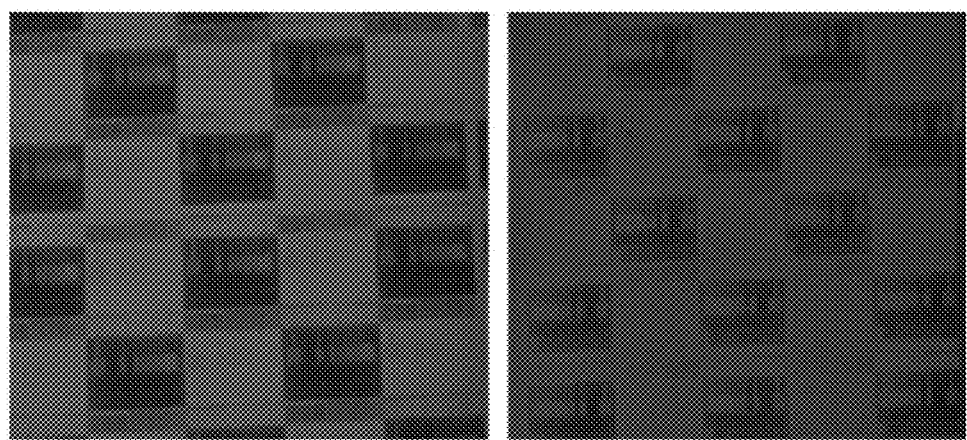
FIG. 4 is photographic images showing that the patterns prepared in Example 1 emit green light and red light respectively when being irradiated with blue light.

The results of FIG. 3 confirm that the composition of Example 1 may form a pattern (line width: 100 micrometers, um) including quantum dots dispersed in a polymer. When the obtained pattern is irradiated with blue light (wavelength: 450 nm), red light or green light is emitted from the pattern (FIG. 4).

Figure 5:
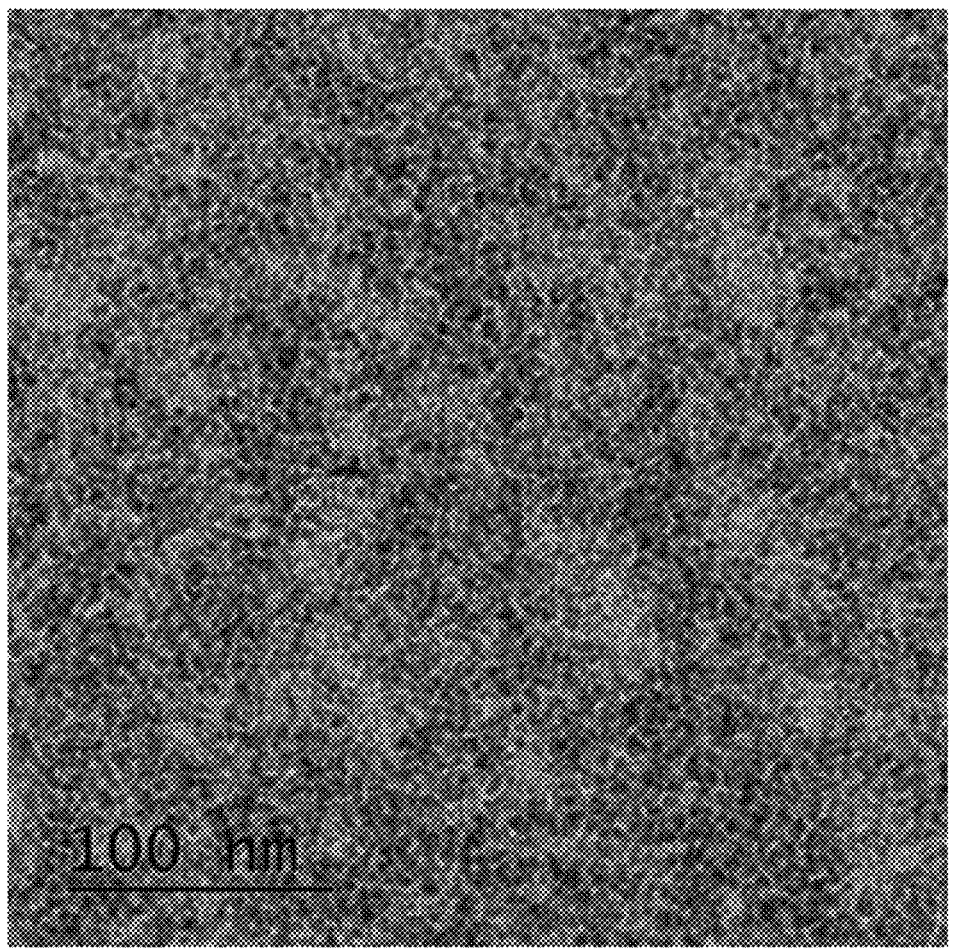
FIG. 5 is an electron-microscopic image showing quantum dots dispersed in the pattern prepared in Example 1.

A transmission electron microscopic image of the obtained pattern is shown in FIG. 5. The results of FIG. 5 confirm that the quantum dots may be uniformly dispersed in the pattern.

Comparative Example 1

100 g of the same binder solution as in Example 1, 100 g of the same photopolymerizable monomer as in Example 1 (a hexaacrylate compound), 1 g of the same photoinitiator as in Example 1, 10 g of glycol di-3-mercaptopropionate (hereinafter, 2T), and 300 g of PGMEA are mixed to prepare a mixture.

To the obtained mixture, the same chloroform solution of the quantum dots as in Example 1 is added to prepare a photosensitive composition.

Figure 6:
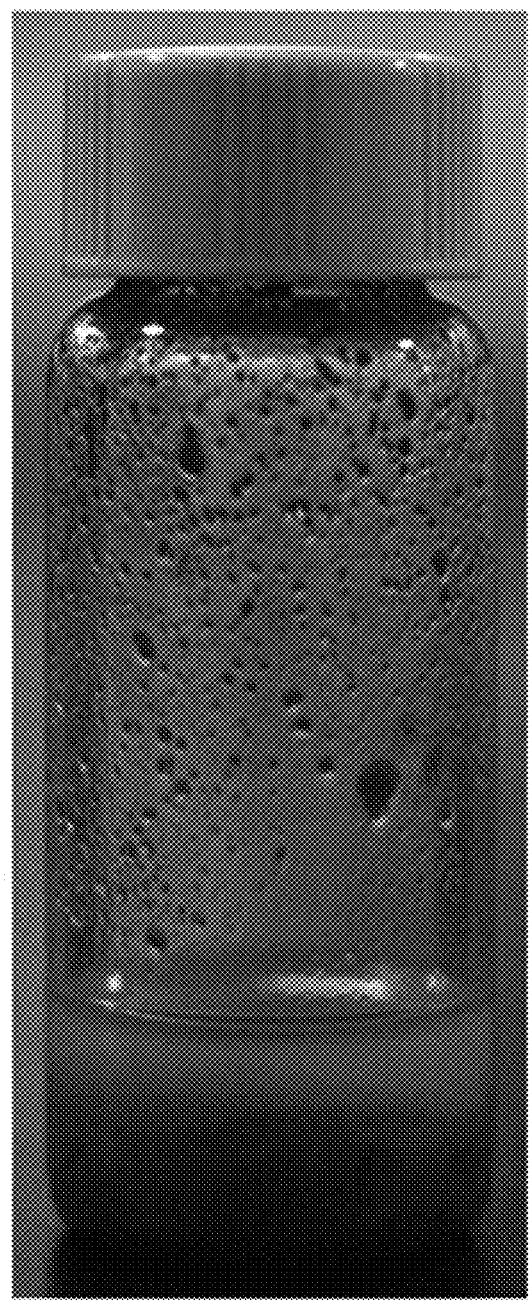
FIG. 6 is a photographic image showing a mixture of the quantum dot composition prepared in Comparative Example 1.

The photographic image of the obtained photosensitive composition is shown in FIG. 6. The results of FIG. 6 confirm that when the same quantum dot solution as in Example 1 is mixed with the same amount and the same type of binder, photopolymerizable monomer, photoinitiator, and solvent as in Example 1, the agglomeration of the quantum dots is significant, and thus a composition including the quantum dots dispersed therein cannot be obtained.

Comparative Example 2

A photosensitive composition is prepared to form a pattern in accordance with the same procedure as in Example 1, except that 100 g of the binder solution (concentration 30 wt %, polypropylene glycol monomethyl ether acetate) includes a binder resin having the same repeating units and an acid value of 30 mg KOH/g, and no reactive compound is used.

Figure 7:
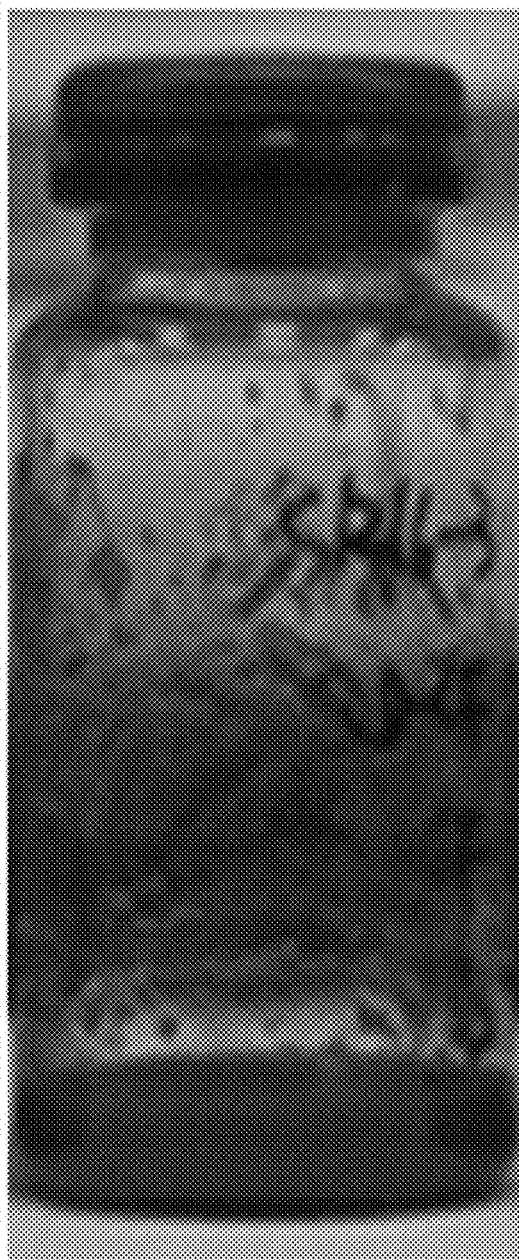
FIG. 7 is a photographic image showing a quantum dot-binder dispersion prepared in Comparative Example 2.

The photographic image of the prepared composition is shown in FIG. 7.

FIG. 7 confirms that the aforementioned binder solution cannot disperse the quantum dots.

Figure 8:
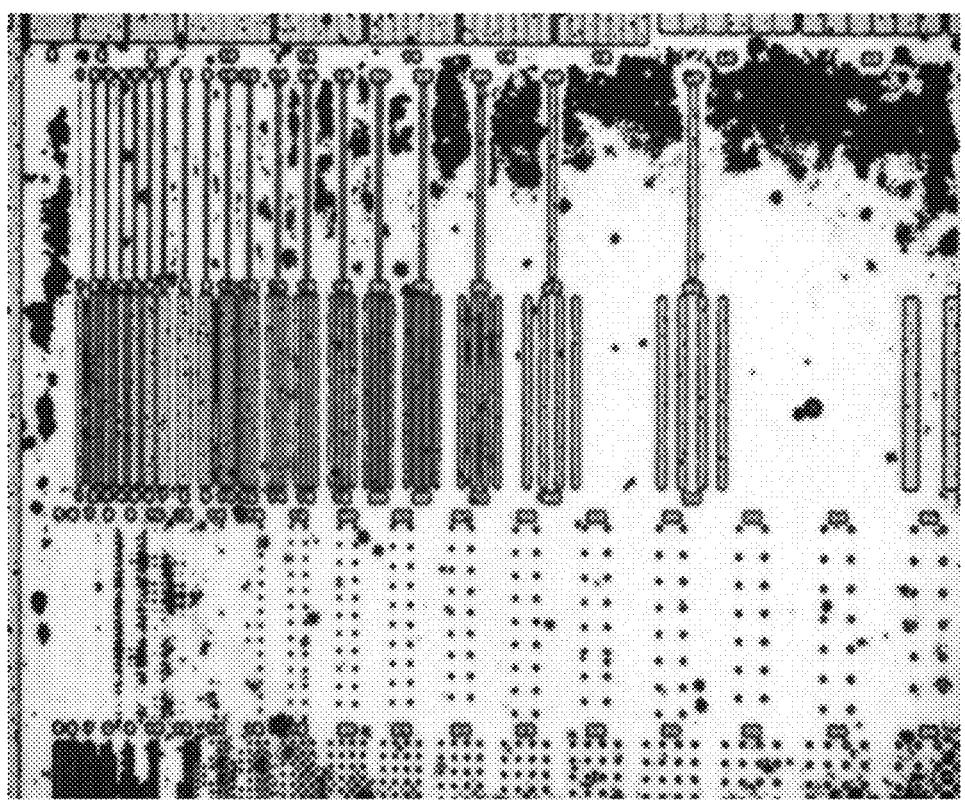
FIG. 8 is an optical microscope photograph of the quantum dot-polymer composite pattern prepared in Comparative Example 2.

The photographic image of the prepared pattern is shown in FIG. 8. FIG. 8 confirms that when the quantum dots fail to be uniformly dispersed in the photosensitive composition, a desired pattern of the quantum dot-polymer composite cannot be obtained.

Comparative Example 3

A photosensitive composition is prepared to form a pattern in accordance with the same procedure as in Example 1, except that 100 g of the binder solution (concentration 30 wt %, polypropylene glycol monomethyl ether acetate) includes a binder resin having the same repeating units and an acid value of 60 mg KOH/g, and no reactive compound is used.

It is confirmed that in the prepared composition, the quantum dots are not dispersed well and are significantly agglomerated, and by using the prepared composition, a desired pattern of the quantum dot polymer composite cannot be obtained.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photosensitive composition comprising:
   a quantum dot dispersion;
   a photopolymerizable monomer comprising a carbon-carbon double bond; and
   a photoinitiator,
   wherein the quantum dot dispersion comprises an acid group-containing polymer and a plurality of quantum dots dispersed in the acid group-containing polymer, and the acid group-containing polymer has an acid value of greater than or equal to about 100 milligrams of KOH per gram of acid group-containing polymer as measured by a titration with a solution of potassium hydroxide,
   wherein the quantum dots comprise an organic ligand bound to a surface thereof, and wherein the organic ligand comprises RCOOH, RNH$_2$, R$_2$NH, R$_3$N, RSH, R$_3$P, ROH, RCOOR', RPO(OH)$_2$, R$_2$POOH (wherein R and R' are independently a C5 to C24 aliphatic hydrocarbon group, a C5 to C20 alicyclic hydrocarbon group, or a C6 to C20 aromatic hydrocarbon group), or a combination thereof,
   wherein the acid group-containing polymer is a copolymer consisting of a first repeating unit, a second repeating unit, and a third repeating unit,
   wherein the first repeating unit is a repeating unit represented by Chemical Formula 1-1, a repeating unit represented by Chemical Formula 1-2, or a combination thereof:

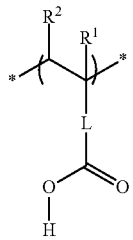

Chemical Formula 1-1 wherein
R$^1$ is hydrogen, a C1 to C3 alkyl group, or —(CH$_2$)$_{n1}$—COOH (wherein n1 is 0 to 2),
R$^2$ is hydrogen, a C1 to C3 alkyl group, or —COOH,
L is a single bond, a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, and
* indicates a portion connected to an adjacent atom;

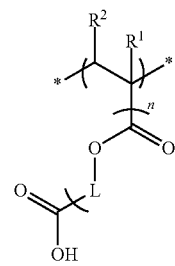

Chemical Formula 1-2 wherein
R$^1$ is hydrogen, a C1 to C3 alkyl group, or —(CH$_2$)$_{n1}$—COOH (wherein n1 is 0 to 2),
R$^2$ is hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, n is an integer of 1 to 3, and

* indicates a portion connected to an adjacent atom;

wherein the second repeating unit is a repeating unit represented by Chemical Formula 2, a repeating unit represented by Chemical Formula 4, a repeating unit represented by Chemical Formula 5, a repeating unit represented by Chemical Formula A, or a combination thereof:

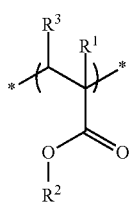

Chemical Formula 2 wherein

R¹ is hydrogen or a C1 to C3 alkyl group,

R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R³ is hydrogen or a C1 to C3 alkyl group, and

* indicates a portion connected to an adjacent atom;

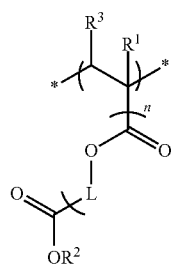

Chemical Formula 4 wherein

R¹ is hydrogen or a C1 to C3 alkyl group,

L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R³ is hydrogen or a C1 to C3 alkyl group, n is an integer of 1 to 3, and

* indicates a portion connected to an adjacent atom;

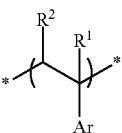

Chemical Formula 5 wherein each of R¹ and R² is independently hydrogen or a C1 to C3 alkyl group,

Ar is a substituted or unsubstituted C6 to C30 aromatic hydrocarbon group or a substituted or unsubstituted C6 to C30 alicyclic hydrocarbon group, and

* indicates a portion connected to an adjacent atom;

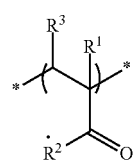

Chemical Formula A wherein

R¹ is hydrogen or a C1 to C3 alkyl group,

R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R³ is hydrogen or a C1 to C3 alkyl group, and

* indicates a portion connected to an adjacent atom, wherein the third repeating unit is a repeating unit represented by Chemical Formula 3:

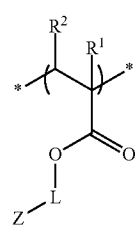

Chemical Formula 3 wherein each of R¹ and R² is independently hydrogen or a C1 to C3 alkyl group,

L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion connected to an adjacent atom, wherein the photosensitive composition is in a form of a colloidal dispersion having a dispersed phase with a dimension of greater than or equal to about 1 nanometer and less than or equal to about 1 micrometer,
wherein in the photosensitive composition, the plurality of quantum dots are configured to have a quantum yield of greater than or equal to about 60% as measured with irradiation of an excitation light,
wherein an amount of the quantum dot comprising the organic ligand is greater than about 5 weight percent based on a total amount of the composition.

2. The photosensitive composition of claim 1, wherein the organic ligand does not comprise a photopolymerizable functional group.

3. The photosensitive composition of claim 2, wherein the organic ligand further comprises a polymeric organic ligand.

4. The photosensitive composition of claim 1, wherein the acid group-containing polymer has an acid value of greater than or equal to about 120 milligrams of KOH per gram and less than or equal to about 200 milligrams of KOH per gram.

5. The photosensitive composition of claim 1, wherein the quantum dot comprises a Group II-VI compound, a Group III-V compound, a Group IV-VI compound, a Group IV element or compound, a Group compound, a Group I—II-IV-IV compound, or a combination thereof.

6. The photosensitive composition of claim 1, wherein the organic ligand comprises RCOOH, wherein R is a C5 to C24 aliphatic hydrocarbon group, and wherein a weight average molecular weight of the acid group-containing polymer is less than or equal to about 50,000 grams per mole.

7. The photosensitive composition of claim 1, wherein the amount of the first repeating unit is greater than 20 mole percent and less than or equal to about 95 mole percent in the acid group-containing polymer.

8. The photosensitive composition of claim 1, wherein the acid group-containing polymer comprises a copolymer of a first monomer selected from (meth)acrylic acid and the second and third monomers selected from alkyl(meth)acrylate, arylalkyl(meth)acrylate, hydroxyalkyl(meth)acrylate, and styrene.

9. The photosensitive composition of claim 1, wherein the acid group-containing polymer has an acid value of between about 125 milligrams of KOH per gram and about 200 milligrams of KOH per gram.

10. The photosensitive composition of claim 1, wherein a weight average molecular weight of the acid group-containing polymer is greater than or equal to about 1,000 grams per mole and less than or equal to about 100,000 grams per mole.

11. The photosensitive composition of claim 1, wherein the photosensitive composition further comprises a solvent, and wherein based on a total amount of the composition, the photosensitive composition comprises:

about 5 percent by weight to about 40 percent by weight of the quantum dots;
about 0.5 percent by weight to about 35 percent by weight of the acid group-containing polymer;
about 0.5 percent by weight to about 30 percent by weight of the photopolymerizable monomer;
about 0.1 percent by weight to about 10 percent by weight of the photoinitiator; and
a balance amount of the solvent.

12. A method of producing a photosensitive composition of claim 1, wherein the method comprises:
dissolving the acid group-containing polymer in the solvent to prepare a polymer solution;
combining the plurality of quantum dots having the organic ligand bonded to a surface thereof with the polymer solution to obtain the quantum dot dispersion; and
combining the quantum dot dispersion with the photopolymerizable monomer comprising a carbon-carbon double bond, the photoinitiator, and optionally a solvent.

13. The method of claim 12, wherein the acid value of the acid group-containing polymer is greater than or equal to about 90 milligrams of KOH per gram and less than about 200 milligrams of KOH per gram.

14. The method of claim 12, wherein the amount of the quantum dot comprising the organic ligand is greater than or equal to about 10 wt % based on a total amount of the composition.

15. The photosensitive composition of claim 1, wherein the amount of the quantum dot comprising the organic ligand is greater than or equal to about 10 wt % based on a total amount of the composition.

16. The photosensitive composition of claim 1, wherein the acid value of the acid group-containing polymer is greater than or equal to about 110 milligrams of KOH per gram and less than about 180 milligrams of KOH per gram and a molecular weight of the acid group-containing polymer is less than or equal to about 50,000 g/mol.

17. The photosensitive composition of claim 1, the photosensitive composition further comprises a light diffusing agent and the light diffusing agent comprises an inorganic oxide particle selected from any of alumina, silica, zirconia, titanium oxide particulates, zinc oxide, or a combination thereof, a metal particle, or a combination thereof.

18. The photosensitive composition of claim 1, wherein the acid value of the acid group-containing polymer is greater than or equal to about 90 milligrams of KOH per gram and less than about 200 milligrams of KOH per gram.

* * * * *